(12) United States Patent
Momose et al.

(10) Patent No.: US 7,119,882 B2
(45) Date of Patent: *Oct. 10, 2006

(54) APPARATUS AND METHOD FOR PROJECTION EXPOSURE

(75) Inventors: Katsumi Momose, Tokyo (JP); Masaru Yamaga, Tokyo (JP); Shinichi Matsunaga, Tokyo (JP)

(73) Assignee: Orc Manufacturing Co., Ltd., Tokyo (JP)

( * ) Notice: Subject to any disclaimer, the term of this patent is extended or adjusted under 35 U.S.C. 154(b) by 149 days.

This patent is subject to a terminal disclaimer.

(21) Appl. No.: 10/836,406

(22) Filed: May 3, 2004

(65) Prior Publication Data

US 2004/0239903 A1 Dec. 2, 2004

(30) Foreign Application Priority Data

May 30, 2003 (JP) .............................. 2003-155291

(51) Int. Cl.
*G03B 27/54* (2006.01)
*G03B 27/42* (2006.01)

(52) U.S. Cl. .......................................... 355/67; 355/53

(58) Field of Classification Search ............ 355/67–71, 355/77, 55; 356/400, 401; 359/727, 649, 359/364–365, 730; 250/548
See application file for complete search history.

(56) References Cited

U.S. PATENT DOCUMENTS 3,998,546 A * 12/1976 Wally et al. ................... 355/53
4,965,785 A * 10/1990 Tadokoro et al. ......... 369/112.24
5,003,341 A * 3/1991 Ohtorii ......................... 355/43
5,121,159 A * 6/1992 Ujiie ............................ 355/38
5,204,711 A * 4/1993 Takubo et al. ................. 355/53
6,043,863 A * 3/2000 Ikeda ............................ 355/53
6,211,942 B1* 4/2001 Okamoto ...................... 355/26
7,006,197 B1* 2/2006 Lee ............................... 355/67
2002/0005940 A1* 1/2002 Hatada et al. ................ 355/55
2003/0081191 A1* 5/2003 Nishi et al. ................... 355/69

FOREIGN PATENT DOCUMENTS

JP          08-179217       7/1996
JP          09-115812       5/1997

* cited by examiner

*Primary Examiner*—Rodney Fuller
(74) *Attorney, Agent, or Firm*—Berenato, White & Stavish LLC

(57) ABSTRACT

An apparatus for projection exposure which projects a pattern of a mask onto a work is provided. The apparatus has a base, a source of light, an optical system, a mask support mechanism, a work support mechanism and an alignment mechanism. The optical system constitutes light rays into projection light rays carrying image information of the mask, guiding the projection light rays through a predetermined optical path so that the projection light rays can be projected onto an exposure surface of the work. The optical system includes a projection optical system and an illumination optical system. The projection optical system is adapted to be disposed vertical relative to the base. The mask and work support mechanisms vertically support the mask and work relative to the base, respectively. In this way, the exposure surface of the work can coincide with an image forming plane in the optical path.

9 Claims, 15 Drawing Sheets

APPARATUS AND METHOD FOR PROJECTION EXPOSURE

BACKGROUND OF THE INVENTION

The present invention pertains to an apparatus and method for projection exposure, which is used for a work, such as a printed circuit board, a liquid crystal board or a color filter for liquid crystal, by projecting a predetermined pattern of a mask onto the work via a projection optical system.

Many kinds of apparatus for projection exposure, which are able to conduct exposure with ultraviolet light of a predetermined wave length, have been introduced for forming a pattern such as an electric circuit for a printed circuit board, a liquid crystal board, a color filter for a liquid crystal and the like.

As shown in FIG. 14 for example, a conventional apparatus 70 for projection exposure includes a light illumination unit 71, a first reflector 72, a fly's eye lens 73, a second reflector 74, a collimating lens 75, a mask M disposed directly under the collimating lens 75, a projection lens 76, a work stage 77 and an image capturing unit 78 such as a CCD camera. A brief description is given to each of these components. The light illumination unit 71 emits light rays carrying ultraviolet light. The first reflector 72 reflects the light rays to steer the optical path of the light rays. The fly's eye lens 73 adjusts the light rays reflected by the first reflector 72. The second reflector 74 reflects the light rays coming through the fly's eye lens 73 so as to change their direction. The collimating lens 75 is disposed in the optical path of the light rays reflected by the second reflector 74. The projection lens 76 is vertically disposed right under the mask M. A work W, which is positioned right under the projection lens 76, is placed on the work stage 77. The image capturing unit 78 is disposed under the work stage 77. Japanese Published Patent Application H9-115812 discloses the related arts.

As shown in FIGS. 15A and 15B, another conventional apparatus 80 for projection exposure includes a light source 81, a reflector 82, a projection lens system 83, a roof prism 84, a right-angle prism 85, a plano-convex lens 86, and a concavo-convex lens 87, a meniscus lens 88, a reflection mirror 89 and a magnification adjuster 90. Brief description is given to each of these components. The light source 81 emits light rays carrying ultraviolet light. The reflector 82 reflects the light rays from the light source 81 to steer their direction. The projection lens system 83 is disposed right under the reflector 82. The roof prism 84 changes the direction of the light rays traveling from the projection lens system 83. The right-angle prism 85 is disposed confronting the roof prism 84 on a closer side of a work W. The plano-convex lens 86 is disposed next to both prisms 84 and 85. The concavo-convex lens 87 is disposed next to the plano-convex lens 86. The meniscus lens 88 is positioned a predetermined distance apart from the concavo-convex lens 87. The reflection mirror 89 is positioned another predetermined distance apart from the meniscus lens 88. The magnification adjuster 90 is disposed under the right-angle prism 85.

The magnification adjuster 90 includes a plano-concave lens 91, a plano-convex lens 92 which is positioned a given distance apart from the plano-concave lens 91, and an actuator 93 which controls the distance between them. Japanese Published Patent Application H8-179217 discloses the related arts.

However, the examples described above, which show conventional apparatus for projection exposure, have the following problems.

The conventional apparatus is not able to eliminate possible occasions of dust falling to a mask and a work, because they are both positioned horizontally relative to its base although a projection lens system is vertically disposed.

The projection lens system of the apparatus for projection exposure, in which convex and concave lenses are coaxially disposed as shown in Japanese Published Patent Application H9-115812, adjusts the magnification of a mask pattern for a work by controlling the distance between particular convex lenses or that between concave lenses. On the other hand, the projection lens system shown in Japanese Published Patent Application H8-179217 controls the distance between plano-convex and plano-concave lenses of the magnification adjuster which is disposed in the optical path of the projection lens system, thereby adjusting the magnification of a mask pattern for a work. These systems necessitate a separate adjustment for the whole optical system in addition to that for the magnification of the mask pattern, which brings its image on the work out of focus.

Recently, it has been requested for an apparatus for projection exposure to accommodate a work whose thickness is less than 0.5 mm. It is difficult to control the relative position of the exposure surface of the work in a vertical direction due to the thinness.

Although there are some which conduct exposure while they vertically hold a work, they cause inconvenience in conducting an alignment adjustment and exposure for the work because they do not have a mechanism which is able to adjust the geometric conditions for the exposure surface of the work.

Some apparatus, which introduces a carrying mechanism so as to automate replacement of a mask, between one in use and the other one waiting in a stock case, has adversely tended to be a large-scale complex. In the circumstances, a compact mechanism for replacement of a mask has been much in demand.

Furthermore, an apparatus for projection exposure, in which adjustment mechanisms such as a shutter and the like are separately disposed in an optical path between a light source and a work or along the optical path, inevitably has complicated structure or requires a cumbersome adjustment.

SUMMARY OF THE INVENTION

In the consideration of the drawbacks described above, the present invention seeks to provide an apparatus and method for projection exposure which are able to eliminate them.

According to an aspect of the present invention, an apparatus for projection exposure which projects a pattern of a mask onto a work is provided. The apparatus has a base, a source of light, an optical system, a mask support mechanism, a work support mechanism and an alignment mechanism. Brief description is given to each of these components. The base supports the components. The source of light produces light rays carrying ultraviolet light of a predetermined wave length. The optical system constitutes the light rays into projection light rays carrying image information of the mask, guiding the projection light rays through a predetermined optical path so that the projection light rays can be projected onto an exposure surface of the work.

The optical system includes a projection optical system and an illumination optical system. The projection optical system is disposed between the mask support mechanism and the work support mechanism, and adapted to be disposed vertical relative to the base. The illumination optical system is disposed between the source of light and the mask support mechanism.

The mask support mechanism vertically supports the mask relative to the base. The work support mechanism vertically supports the work relative to the base so that the exposure surface of the work can coincide with an image forming plane in the optical path. The alignment mechanism adjusts an alignment between the exposure surface of the work and the mask.

The apparatus described above can reduce failure in exposure due to dust falling to the work because the work, mask and projection optical system are vertically positioned relative to the base. It is also possible to obtain stable performance in terms of image forming because the eccentricity of lens elements due to the gravitational force is eliminated by vertically positioning the projection optical system relative to the base.

According to another aspect of the present invention, an apparatus for projection exposure is provided, whose projection optical system includes an input convex lens, an output convex lens, a reflector, a reflection compensating optical system and a slide mechanism. Brief description is given to each of these components. Projection light rays penetrate the input convex lens so as to be refracted. The projection light rays travel out through the output convex lens, and the output convex lens is adapted to have an optical axis in common with the input convex lens. The reflector has first and second reflection surfaces which form a predetermined angle, and is positioned between the input and output convex lenses. The reflection compensating optical system reflects the projection light rays, which are reflected by the first reflection surface, back to the second reflection surface. The slide mechanism, to which the input and output convex lenses are attached with a predetermined distance therebetween, is able to move the lenses in a direction of the optical axis of the lenses.

The apparatus described above is able to adjust the magnification with keeping the image on the work in focus. The reason for this is that because the input and output convex lenses are coaxially disposed in such a manner that they are spatially symmetrical relative to the reflection compensating optical system and the reflector, they can move in the direction of the optical axis, keeping the predetermined distance.

According to still another aspect of the present invention, an apparatus for projection exposure is provided, whose work support mechanism has a mounting plate, a vertical support frame, an attachment member and a first work positioning mechanism. Brief description is given to each of these components. A work is mounted to the mounting plate. The vertical support frame, vertically relative to the base, supports the mounting plate to which the work is mounted, and has a frame opening which confronts the exposure surface of the work. The attachment member attachably or detachably fixes the mounting plate to the vertical support frame. The first work positioning mechanism supports and moves the vertical support frame within a vertical plane in which the work is positioned.

In the work support mechanism described above, when a carrying mechanism hands over the work placed on the mounting plate, the vertical support frame receives the mounting plate while the exposure surface of the work confronts the frame opening and the attachment member fixes the mounting plate. The first work positioning mechanism moves the vertical support frame, to which the mounting plate is fixed, within the vertical plane. In this way, even if the thickness of a work is small, the apparatus for projection exposure is able to stabilize the accuracy of exposure because the geometric conditions of the exposure surface of the work are appropriately controlled as a result of the flatness of the work maintained by the mounting plate.

According to yet another aspect of the present invention, an apparatus for projection exposure is provided, whose first work positioning mechanism is positioned closer side of a projection optical system relative to an image forming plane which coincides with the exposure surface of a work.

In the apparatus described above, delivering and receiving of the work can be more easily conducted because a carrying mechanism is allowed to be disposed next to a work support mechanism as a result of the first work positioning mechanism being adapted not to interfere with the carrying mechanism.

According to a further aspect of the present invention, an apparatus for projection exposure is provided, whose work support mechanism has a detector module for detecting geometric conditions of the exposure surface of a work and a second work positioning mechanism for moving a vertical support frame according to the geometric conditions in a horizontal direction perpendicular to a vertical plane in which the work is positioned.

The work support mechanism described above can stabilize accuracy of exposure because the geometric conditions of the exposure surface of the work are appropriately controlled by the detector module and the second work positioning mechanism. In addition, the apparatus is able to conduct focus adjustment for the exposure surface of the work, which is required as a result of change in the thickness of work. Furthermore, the second work positioning mechanism is able to simultaneously adjust the gradient and relative position of the exposure surface because it has separately movable members.

According to a still further aspect of the present invention, an apparatus for projection exposure is provided, whose mask support mechanism has a mask support frame, a mask positioning mechanism and a switching mechanism. The mask support frame vertically supports the mask relative to a base. The mask positioning mechanism supports and moves the mask support frame within a vertical plane in which the mask is positioned. The switching mechanism supports and slides the mask support frame vertically relative to the base so that a pattern of the mask can be replaced. The switching mechanism also supports the mask positioning mechanism.

The apparatus described above is able to quickly replace the pattern of the mask. It is also possible to quickly proceed to an alignment adjustment and projection exposure for a new pattern because only the minimum adjustment is required after the replacement.

According to a yet further aspect of the present invention, an apparatus for projection exposure is provided, whose optical system has a disk that is rotatably disposed in its optical path. The disk includes a visible-light filter, a blocking portion and an opening. Description is given to each of these components. The visible-light filter selects visible light from the light rays produced by a light source. The blocking portion, by which the light rays are intercepted, is disposed next to the filter. The opening, through which the light rays pass, is disposed next to the blocking portion.

The apparatus described above is able to position one of the visible-light filter, blocking portion and opening in the optical path of the light rays. When an alignment adjustment is conducted, the visible-light filter is positioned in the optical path. When an exposure is executed, the opening is positioned in the optical path. When a work does not need to be illuminated by the light rays produced by a light source, the blocking portion is positioned in the optical path. In this way, the apparatus is able to conduct a magnification adjustment, in which both convex lenses are moved in a direction of the optical axis, an alignment adjustment between a mask and a work, and an exposure while the light source is continuously turned on.

According to another aspect of the present invention, a method for projection exposure using a projection optical system is provided, which includes a reflector, input and output convex lenses as well as a reflection compensating optical system. The reflector has first and second reflection surfaces which steer a direction of light rays produced by a light source of an optical system. The input and output convex lenses are disposed on both sides of the reflector. The reflection compensating optical system reflects the light rays, which are reflected by the first reflection surface, back to the second reflection surface.

When a magnification of the projection optical system is adjusted to be low, the method has the following steps; moving the input and convex lenses so that the input convex lens can recede from the reflector and the output convex lens can come closer to the reflector in a direction of an optical axis while a distance between the input and output convex lenses is kept constant, and conducting projection exposure.

On the other hand, when the magnification of the projection optical system is adjusted to be high, the method has the following steps; moving the input and output convex lenses so that the input convex lens can come closer to the reflector and the output convex lens can recede from the reflector in the direction of the optical axis while the distance between the input and output convex lenses is kept constant, and conducting projection exposure.

In the method described above, when an exposure is conducted for a mask pattern with the magnification of 1.0, both convex lenses are disposed symmetrically relative to the reflector. When the magnification is adapted to be lower, both convex lenses are made to recede from the work along their optical axis. Seeing their individual positions relative to the reflector, it is known that the input convex lens recedes from the reflector and the output convex reflector comes closer to the reflector. In this way, it is possible to adjust a magnification without an adjustment of focus. When the magnification is adapted to be higher, the adjustment can be conducted if both lenses are made to come closer to the work.

DESCRIPTION OF THE PREFERRED EMBODIMENTS

An exemplary embodiment of the present invention is now described with reference to the accompanying drawings.

Figure 1:
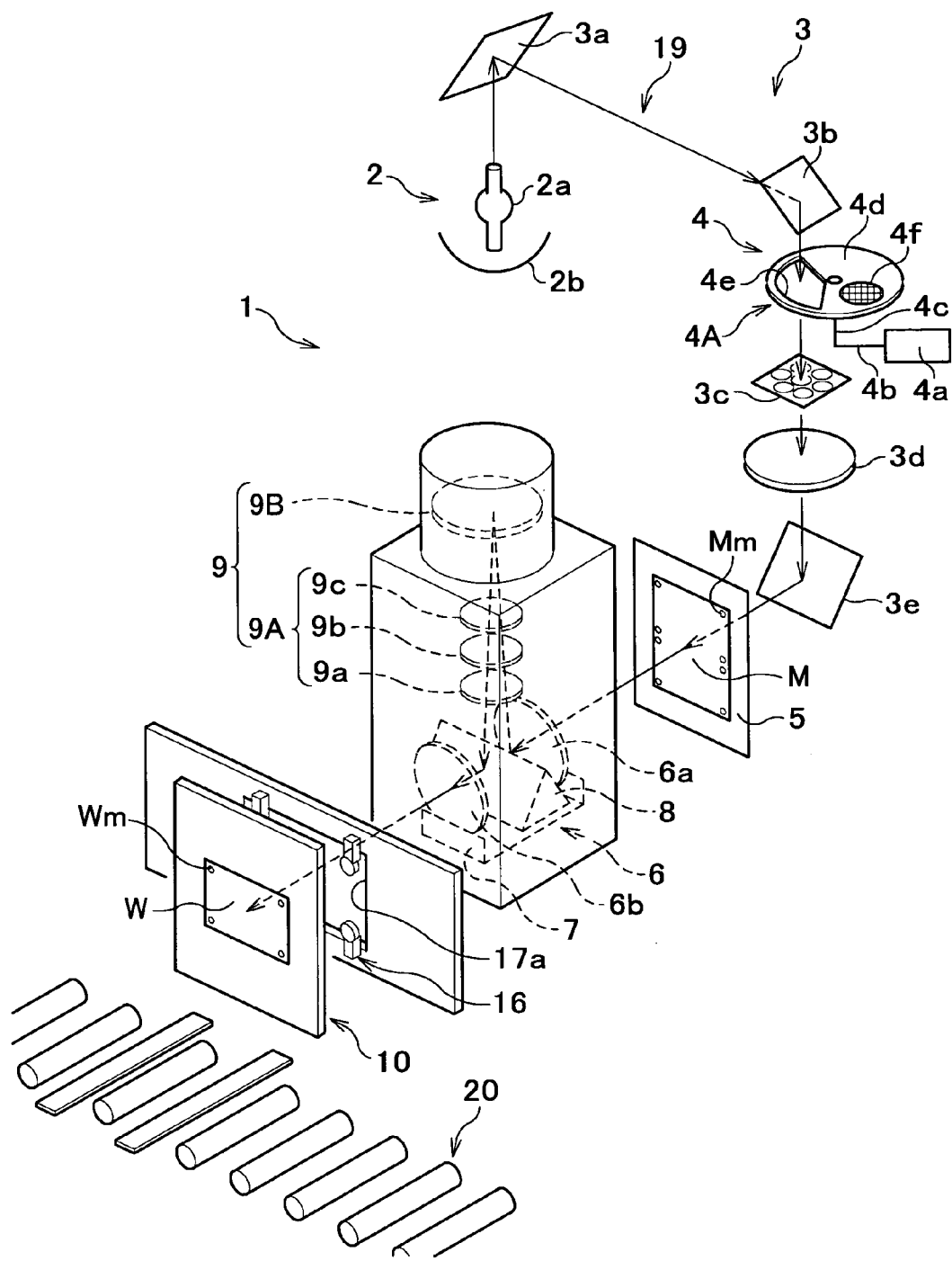
FIG. 1 is a schematic diagram illustrating overall an apparatus for projection exposure according to the present invention.

As shown in FIG. 1, an apparatus 1 for projection exposure includes a light source 2, an optical system 19, a rotation mechanism 4, a mask support mechanism 5, a work support mechanism 10 and an alignment mechanism.

The light source 2 generates light rays carrying ultraviolet light with a determined wave length. The optical system 19, which includes an illumination optical system 3 and a projection optical system 6, makes the light rays pass through a mask M so that the light rays can carry the information of the mask M, guiding the light rays to a work W via a predetermined optical path. The rotation mechanism 4 has a disk 4A, which is disposed at a predetermined position in the optical path that is formed by the optical system 19. The mask support mechanism 5 supports the mask M vertically relative to a base BS of the apparatus 1 at a predetermined position in the optical path. The projection optical system 6 is disposed between the mask support mechanism 5 and the work W in the optical path. The work support mechanism 10 supports the work W vertical relative to the base BS. The alignment mechanism, which includes a visible-light filter, a first work positioning mechanism and an image module, adjusts alignment between the mask M and the work W with a mask mark Mm and a work mark Wm as reference.

In this connection, a carrying mechanism 20, which is able not only to receive the work W from the work support mechanism 10 but also to deliver it thereto, is provided as a mechanism separately disposed relative to the apparatus 1.

As shown in FIG. 1, the light source 2 has a discharge lamp 2a such as a short arc lamp which emits light rays carrying ultraviolet light with a predetermined wave length, and an elliptic reflector 2b which is disposed behind the discharge lamp 2a. The light source 2, which directs the light rays upward in the above description, may alternatively direct them downward by modification of the disposition of the discharge lamp 2a.

As shown in FIG. 1, the illumination optical system 3 has a first reflector 3a, a second reflector 3b, a fly's eye lens 3c, a collimating lens 3d and a third reflector 3e. The first reflector 3a adjusts the direction of the light rays generated by the light source 2 from a vertical to lateral direction. The second reflector 3b adjusts reversely the direction of the light rays from the lateral to vertical direction. The fly's eye lens 3c makes an adjustment for the light rays reflected by the reflector 3b. The collimating lens 3d converts the light rays coming through the fly's eye lens into parallel light rays. The third reflector 3e adjusts the direction of the parallel light converted by the collimating lens 3d from the vertical to horizontal direction.

In this connection, the illumination optical system 3 may alternatively be configured in a different manner than that described above as long as it can form an appropriate optical path from the light source 2 to the exposure surface of the work W.

As shown in FIG. 1, the rotation mechanism 4 has a disk 4A, a rotational shaft 4c, a drive motor 4a such as a servo motor or step motor, and a coupling mechanism 4b. The disk 4A is disposed between the second reflector 3b and the fly's eye lens 3c in the optical path, and rotatably supported by the rotational shaft 4c. The drive motor 4a drives the disk 4A so as to rotate it about the rotational shaft 4c by a predetermined angle. The coupling mechanism 4b transmits drive force of the motor 4a to the rotational shaft 4c. The disk 4A, whose rotational shaft 4c is eccentrically positioned relative to an optical axis, has in its angular direction a blocking portion 4d for intercepting the light rays, an opening 4e for letting the light rays pass through and a visible-light filter 4f for selecting visible light rays, thereby providing sequential switching of interception, traveling and filtering for the light rays.

The visible-light filter 4f is characterized in that it is able to select particular light rays out of the light rays generated by the discharge lamp 2a so that the selected visible light rays have wave lengths which have no effect on exposure of the work W. For example, the visible-light filter 4f selects visible yellow light rays which are appropriate for use in adjusting the alignment between the work W and the mask M. It may be preferable to add a material such as a thin membrane absorbing the light rays to the blocking portion 4d. In this connection, it may be possible to dispose a cooling fan near the rotation mechanism 4A or circulate a cooling fluid inside it.

Figure 2:
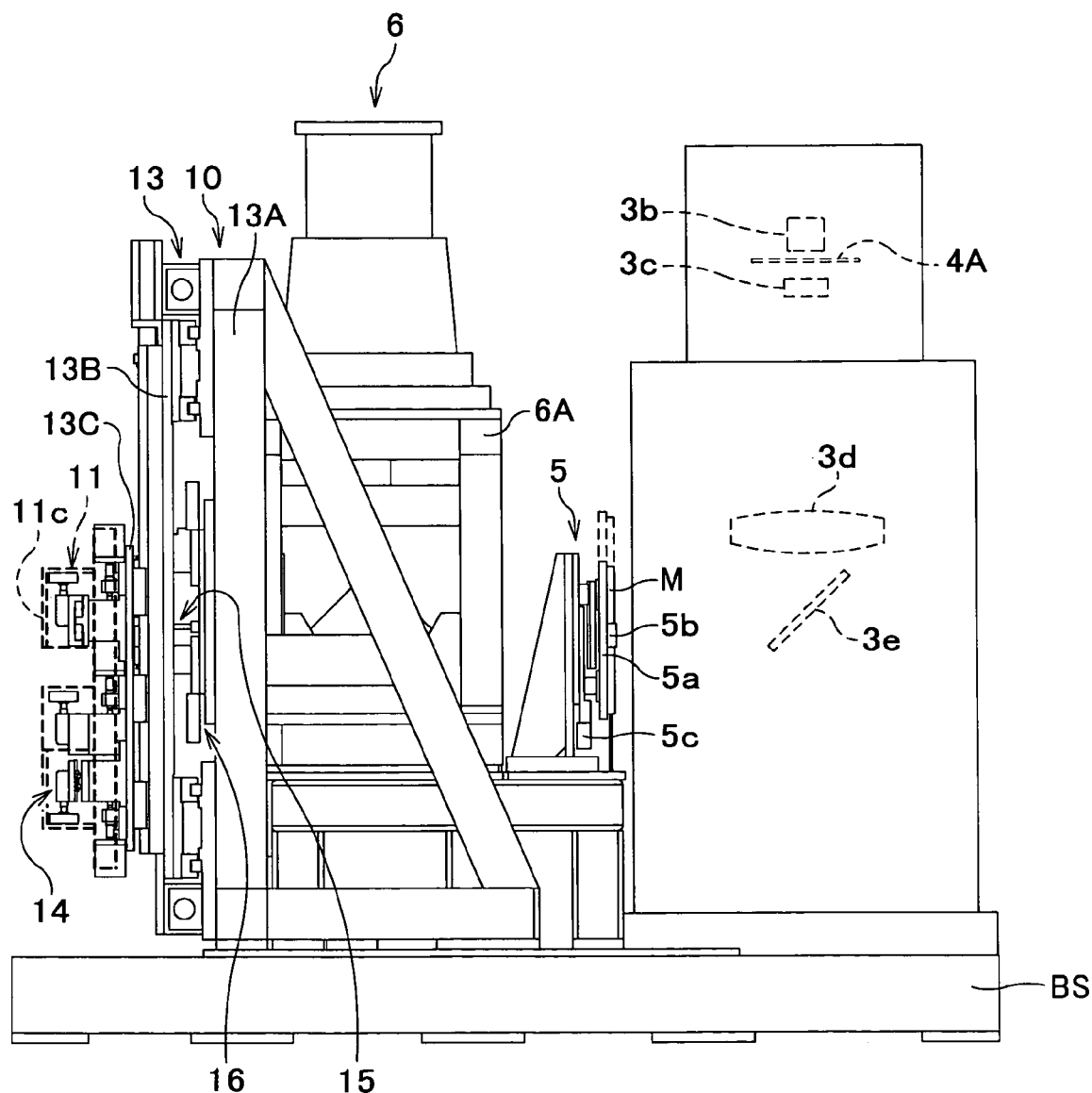
FIG. 2 is a side view showing an apparatus for projection exposure according to the present invention.
Figure 3:
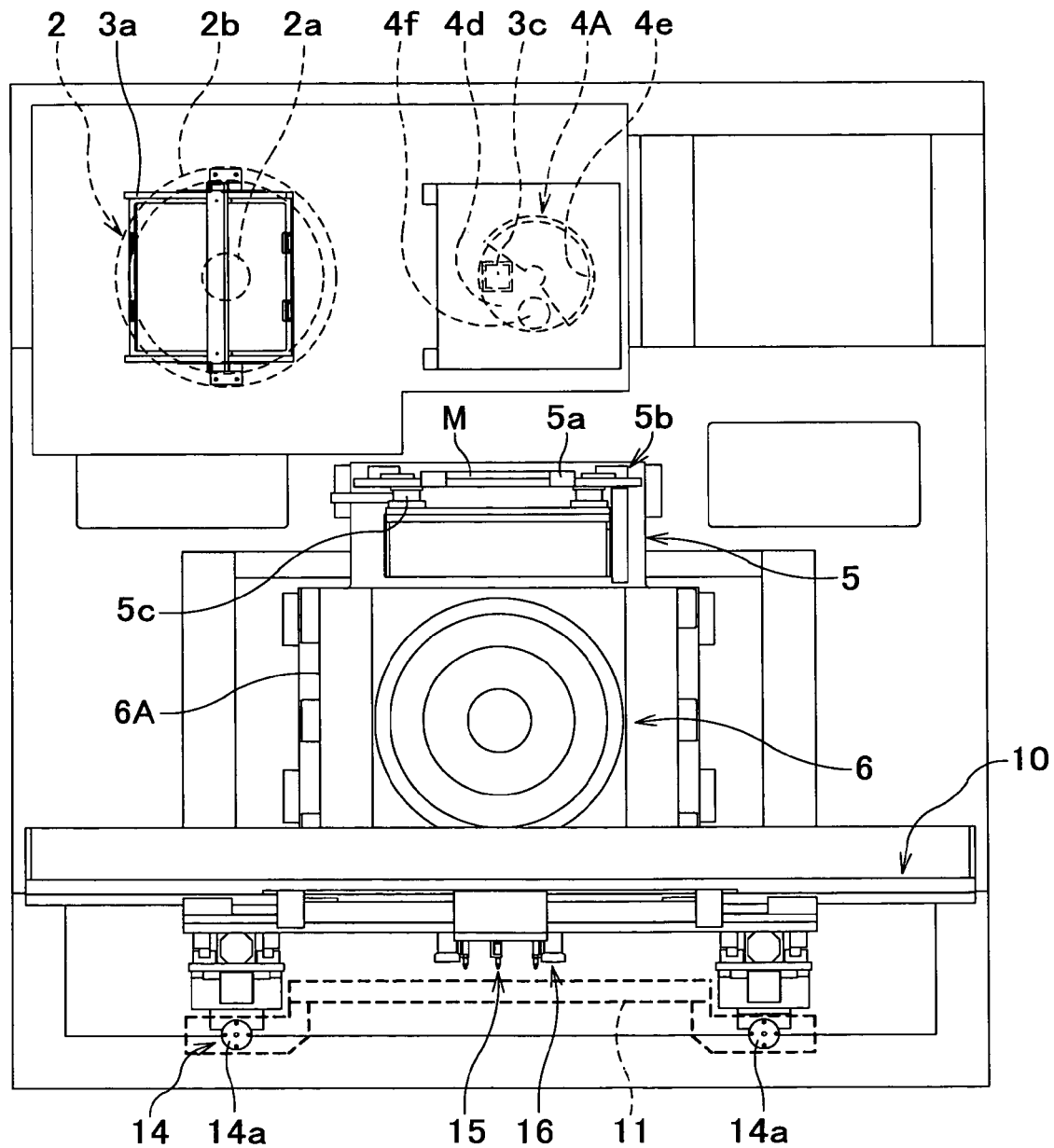
FIG. 3 is a plan view showing an apparatus for projection exposure according to the present invention.

As shown in FIGS. 1 to 3, the mask support mechanism 5 is disposed between the third reflector 3e and the projection optical system 6.

Figure 4:
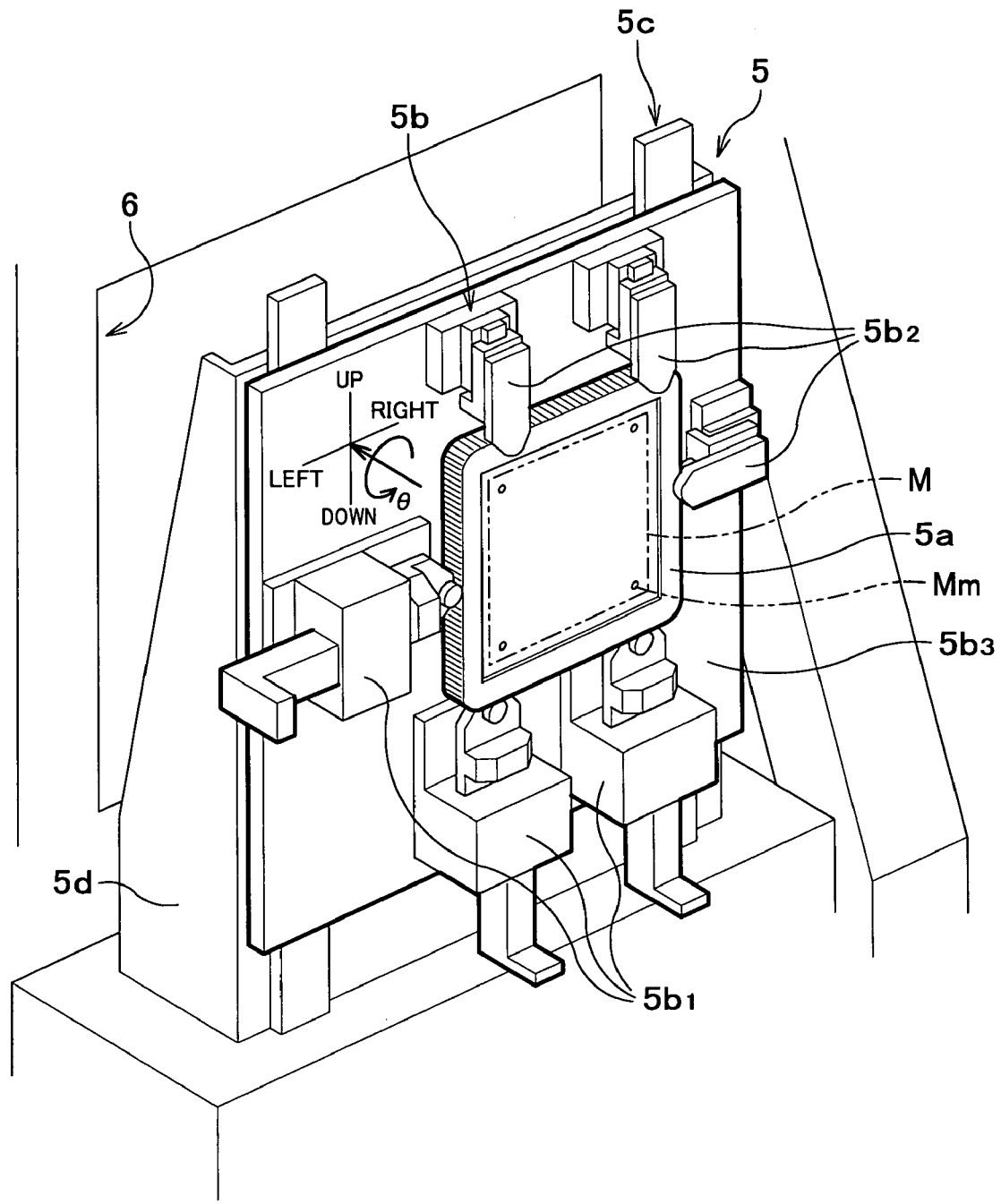
FIG. 4 is a perspective view showing the mask support mechanism of an apparatus for projection exposure according to the present invention.

FIG. 4 is a perspective view showing a mask support mechanism of an apparatus for projection exposure. The mask support mechanism 5 includes a mask support frame 5a, a mask positioning mechanism 5b and a switching mechanism 5c. The mask support frame 5a supports the mask M vertical relative to the base BS. The mask positioning mechanism 5b provides movement for the mask support frame 5a in predetermined directions. The switching mechanism 5c supports the mask positioning mechanism 5b and slidably moves it vertically.

The mask support frame 5a has a translucent plate touching the mask M and a sucking mechanism (not shown) for holding the mask M to the translucent plate. It is noted that the mask support frame has at least an area sufficient for supporting a mask M which has two kinds of pattern in the vertical direction.

As shown in FIG. 4, the mask positioning mechanism 5b, which has a three-point locator, is able to provide adjustment for positioning of the mask M. The mask positioning mechanism 5b, which includes a drive member 5b1 and a driven member 5b2, is disposed along one side and other neighboring two sides of the mask support frame 5a. The drive member 5b1 thrusts the mask support frame 5a in right-left and up-down directions. The driven member 5b2 is disposed confronting the drive member 5b1 across the mask support frame 5a. The drive and driven members 51a and 51b are attached to a vertical plate 5b3.

The mask support frame 5a is movably supported in-plane because it is mounted to the vertical plate 5b3 via a spherical contact member (not shown), being continuously pressed to the vertical plate 5b3 by the drive member 5b1 and the driven member 5b2. In this way, the position of the mask M supported by the mask frame 5a is determined correctly relative to an X-Y axis of a first work positioning mechanism 13 while the mask M is under setting-up because both translational movement, a right-left (X) direction and an up-down (Y) direction, and rotational movement (θ direction about an optical axis) are systematically controlled.

The vertical plate 5b3 is supported by a vertical stand 5d via the switching mechanism 5c such as a linear motion (LM) guide, which is able to vertically slide the mask support frame 5a. When the mask M has two kinds of patterns, the switching mechanism 5c is able to switch the patterns by vertical slide movement. The vertical stand 5d and the vertical plate 5b3 have openings which confront the mask M.

Figure 5:
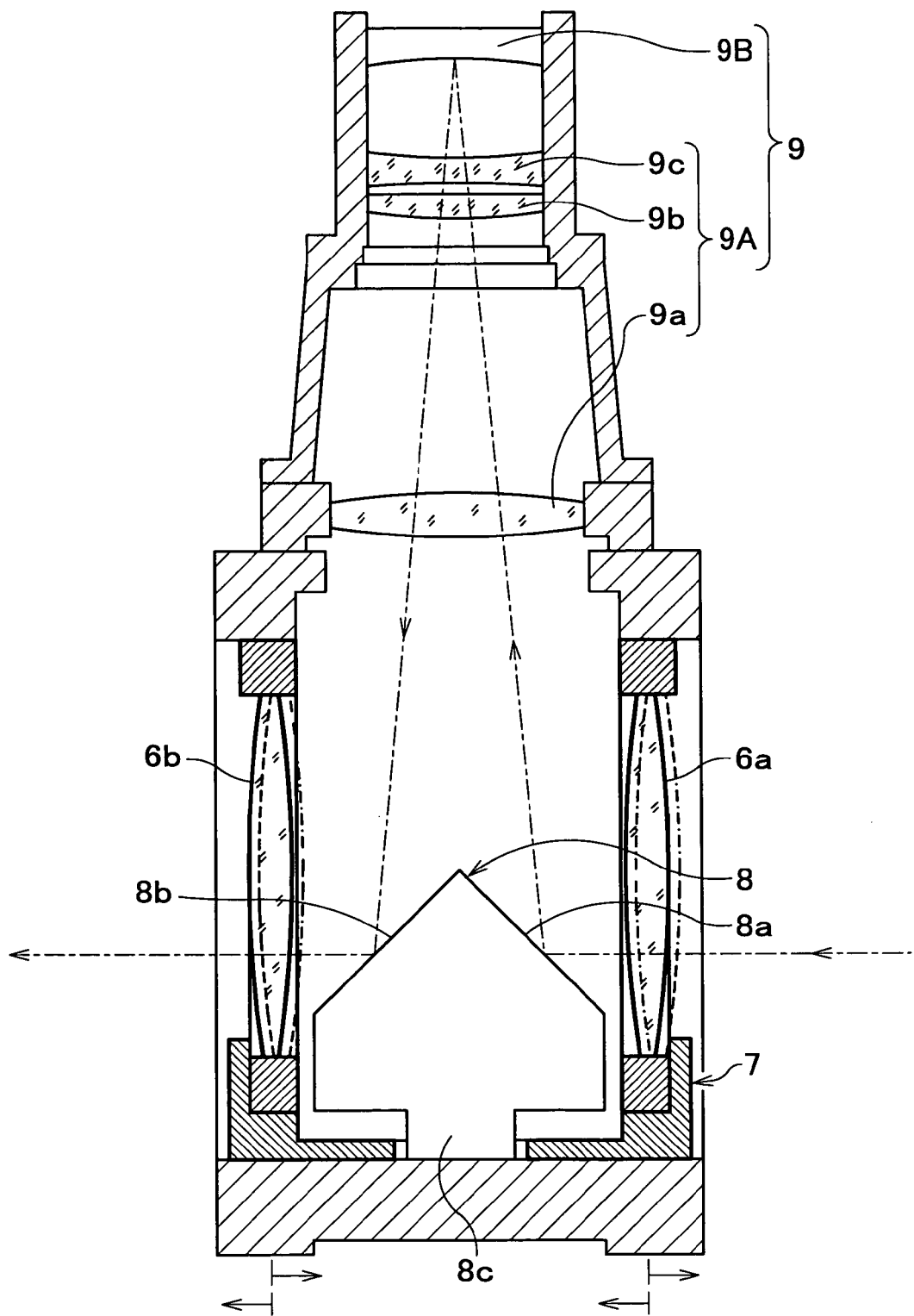
FIG. 5 is a sectional view showing the projection optical system of an apparatus for projection exposure according to the present invention.
Figure 6:
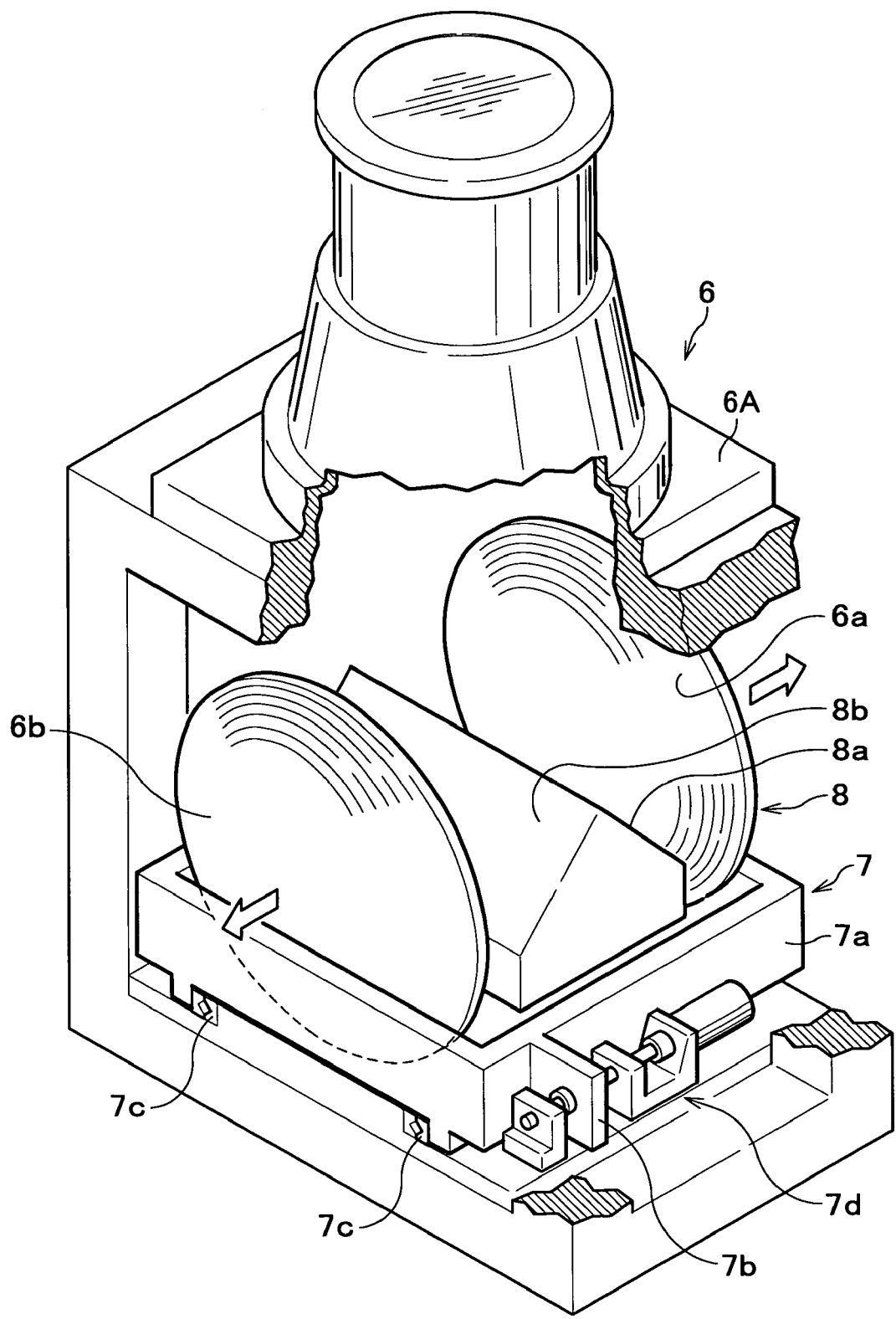
FIG. 6 is a perspective view schematically illustrating the projection optical system of an apparatus for projection exposure according to the present invention.

Description is given to a projection optical system 6. FIG. 5 is a sectional view showing a projection optical system of the present invention. FIG. 6 is a perspective view schematically showing the projection optical system. As shown in FIGS. 5 and 6, the projection optical system 6 has an input convex lens 6a, an output convex lens 6b, a reflector 8 and a reflection compensating optical system 9. The lenses 6a and 6b are coaxially supported by a slide mechanism 7 with a predetermined distance between them. The reflector 8 is disposed between the lenses 6a and 6b. The reflection compensating optical system 9 reflects the light rays which are steered by the reflector 8 back to it. The lenses 6a and 6b, the reflection compensating mechanism 9 and the slide mechanism 7 are disposed within a case 6A.

The reflection compensating optical system 9 is disposed in the upper and middle portions of the case 6A, and the lenses 6a and 6b, the reflector 8 and the slide mechanism 7 are disposed in the lower portion of the case 6A.

The lenses 6a and 6b are disposed on both sides of the reflector 8. A single lens of the same refractive index is used for each of the lenses 6a and 6b.

As shown in FIGS. 5 and 6, the reflector 8 has a first reflection surface 8a, a second reflection surface 8b and a pedestal 8c. The first reflection surface 8a steers the light rays coming through the input convex lens 6a from a horizontal to vertical direction. The second reflection surface 8b steers the light rays reflected by the reflection compensating optical system 9 from a vertical to horizontal direction. The reflector 8 is secured to a predetermined position of a support table 7*a* via the pedestal 8*c*. The reflector 8 secured to the support table 7*a* is disposed in the case 6A.

As shown in FIG. 5, the reflection compensating optical system 9 has a compensation optical system 9A which compensates chromatic aberration of the light rays reflected by the reflector 8, and a concave reflector 9B which reflects the light rays coming through the compensation optical system 9A.

The light rays reflected by the concave reflector 9B penetrate the compensation optical system 9A, then impinging on the second reflection surface 8*b*. The curvature and focal length of the concave reflector 9B as well as its vertical position are determined according to the spatial disposition of the input concave lens 6*a*, the reflector 8 and the compensation optical system 9A.

The compensation optical system 9A has coaxially disposed three lenses, namely first and second convex lenses 9*a* and 9*b* as well as a concave lens 9*c*. Each of these lenses 9*a*, 9*b* and 9*c* is a single lens. If stringent accuracy requirements are not imposed on, it may be possible to dispense with one of the first and second convex lenses 9*a* and 9*b*. In other words, one of the first and second convex lenses 9*a* and 9*b* in addition to the concave lens 9*c* are a minimum requirement for the compensation optical system 9A.

As shown in FIG. 6, the slide mechanism 7 has a support table 7*a*, an engagement member 7*b*, a slide rail 7*c* and a drive module 7*d*. The support table 7*a* holds the input and output convex lenses 6*a* and 6*b* so that they can keep a predetermined distance. The slide rail 7*c* slidably supports the support table 7*a* in a direction of the optical axis. Along the slide rail 7*c*, the drive module 7*d* moves the support table 7*a*, which is mechanically coupled with the drive module 7*d* via the engagement member 7*b*.

As shown in FIGS. 5 and 6, the pedestal 8*c* is secured to the case 6A through a through hole made in the middle of support table 7*a*. The slide rail 7*c*, which is adapted to be parallel with the optical axis of the convex lenses 6*a* and 6*b*, supports the support table 7*a* under its back surface and on both sides of the pedestal 8*c*. It may be possible to use a linear guide such as an LM guide for the slide rail 7*c*.

The drive module 7*d*, which provides the support table 7*a* with movement in the optical axis direction via the engagement member 7*b* that is driven to slide in parallel with the slide rail 7*c*, has a drive motor such as a servo motor and a mechanical coupling member such as a feed screw. It may be possible to select an air cylinder or a hydraulic cylinder instead of the drive motor for the drive module 7*d* as long as it is able to accurately control the position of support table 7*a*.

The movement of convex lenses 6*a* and 6*b* in the optical axis direction driven by the slide mechanism 7 is conducted in the following steps. In this connection, the reason for requiring the movement of slide mechanism 7 or the adjustment of magnification for projection is that compensation should be necessary when the circuit pattern of a work W happens to expand or contract during its manufacturing steps.

When projection is conducted for a work W with a ratio of 1 (equal size), the drive mechanism 7*d* is controlled so as to position the support table 7*a* so that the distance between the input convex lens 6*a* and the first reflection surface 8*a* can coincide with that between the output convex lens 6*b* and the second reflection surface 8*b*. The relationship between magnification and the movement of lenses 6*a* and 6*b* is in advance stored in a control module (not shown) belonging to the slide mechanism 7.

When a projection ratio is adapted to decrease, the drive mechanism 7*d* is controlled so as to make the support table 7*a* recede from the work W. As a result, the input convex lens 6*a* recedes from the reflector 8, but reversely, the output convex lens 6*b* comes closer to the reflector 8.

On the other hand, when the projection ratio is adapted to increase, the drive mechanism 7*d* is inversely controlled with regard to the case described above. In this way, the lens 6*a* comes closer to the reflector 8, but the lens 6*b* recedes from the reflector 8.

Figure 7:
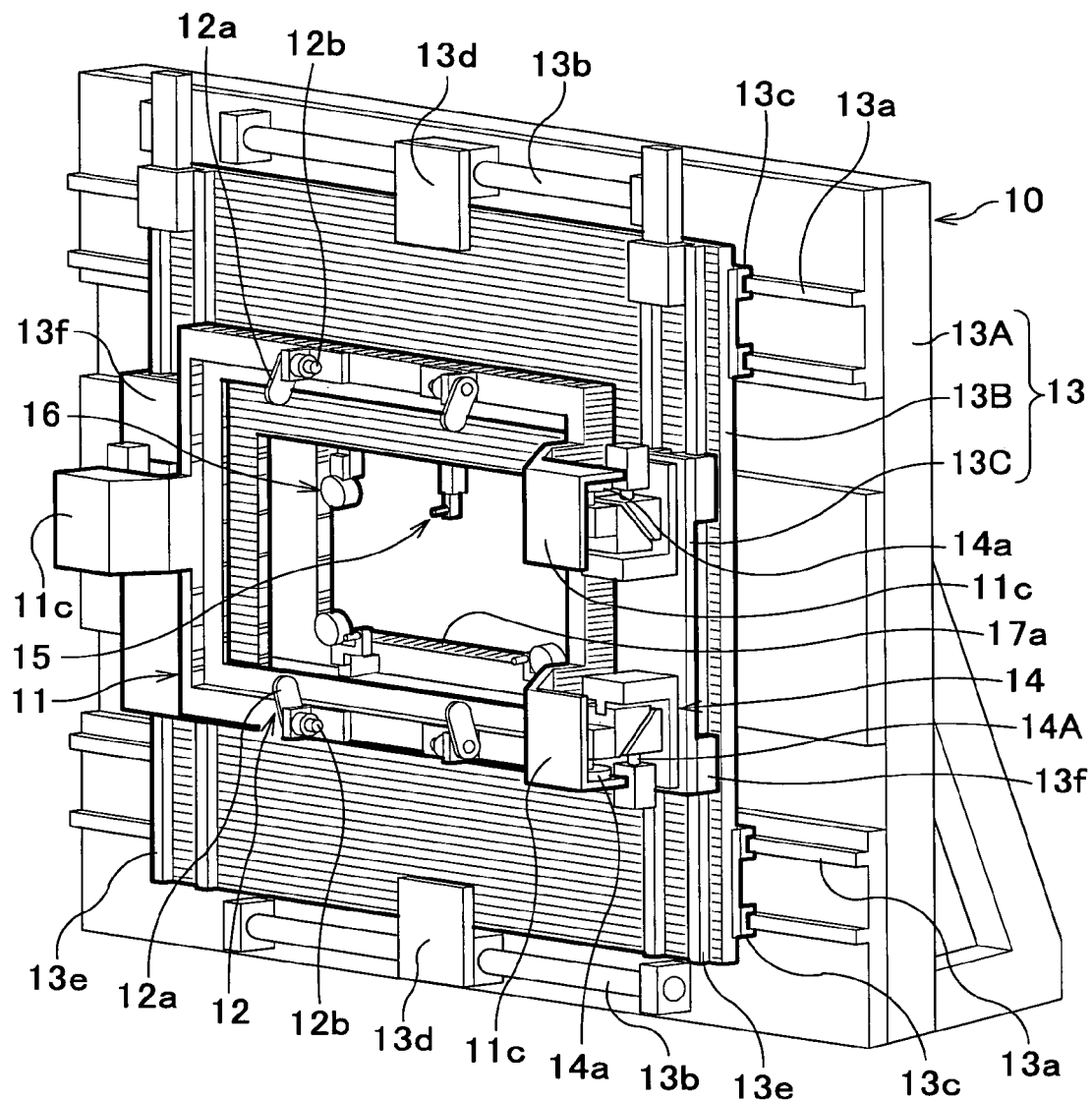
FIG. 7 is a perspective view showing the work support mechanism of an apparatus for projection exposure according to the present invention.
Figure 8:
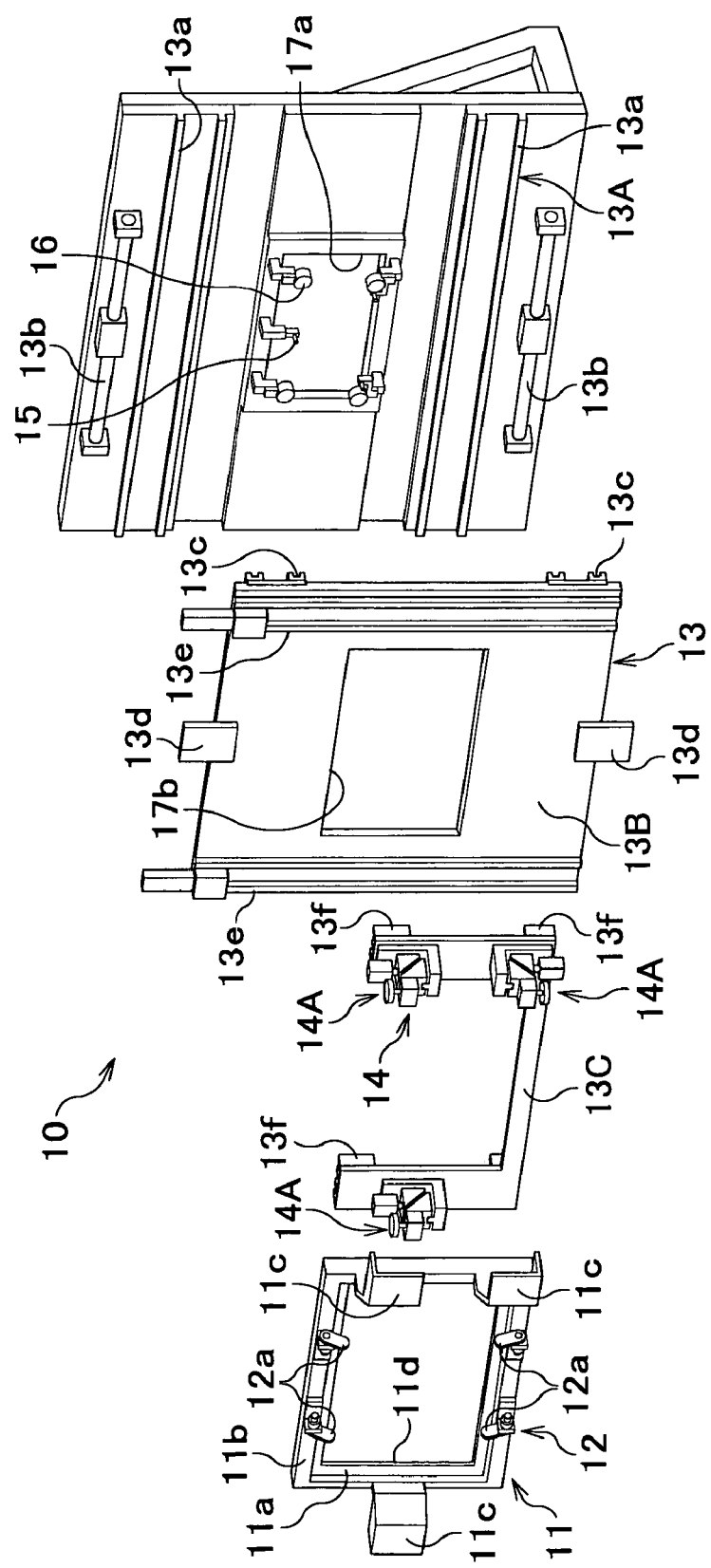
FIG. 8 is an exploded perspective view showing the work support mechanism of an apparatus for projection exposure according to the present invention.
Figure 9:
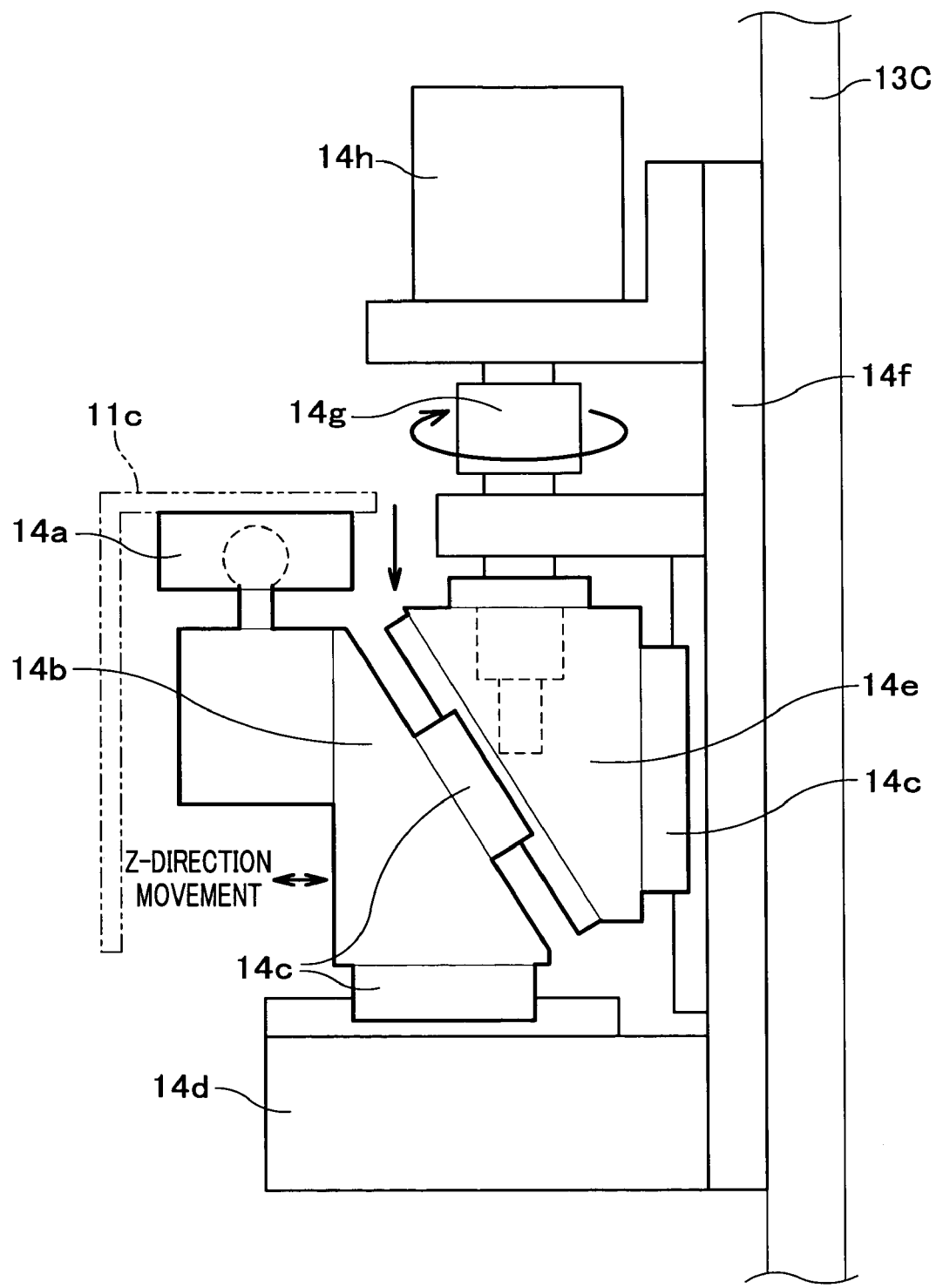
FIG. 9 is a side view showing the second work positioning mechanism of an apparatus for projection exposure according to the present invention.

Description is given to the work support mechanism 10. FIG. 7 is a perspective view showing the work support mechanism of an apparatus for projection exposure. FIG. 8 is an exploded perspective view showing the work support mechanism. FIG. 9 is a side view showing a second work positioning mechanism. As shown in FIGS. 7 and 8, the work support mechanism 10 has a vertical support frame 11, an attachment member 12, a first work positioning mechanism 13 and a second work positioning mechanism 14. The vertical support frame 11 has a frame opening 11*d* and holds a mounting plate 21 (see FIG. 13) to which the work W is mounted. The attachment member 12 detachably secures the mounting plate 21 which is supported by the vertical support frame 11. The first work positioning mechanism 13 slides the vertical support frame 11 in a vertical plane. The second work positioning mechanism 14 movably supports the vertical frame 11 horizontally, or in the direction of the optical axis (hereinafter referred to as "Z-direction").

The vertical frame 11, which has the frame opening 11*d* for the exposure surface of the work, has a contact portion 11*a*, an enclosing portion 11*b* and brackets 11*c*. The contact portion 11*a* contacts with the frontal periphery of the work W or the periphery of the mounting plate 21. The enclosing portion 11*b* has a step around the contact portion 11*a*. The brackets 11*c*, which project from predetermined positions on the enclosing portion 11*b* in the Z-direction, are mechanically coupled with the second work positioning mechanism 14.

The attachment mechanism 12 is attached to the enclosing portion 11*b*. The attachment mechanism 12 has a contact member 12*a* which holds the mounting plate 21 by touching its back, and a drive member 12*b* which drives the contact member 12*a* to touch or recede from the back of mounting plate 21. Although the attachment member 12 has four contact members 12*a* and drive members 12*b* respectively as shown in FIGS. 7 and 8, it may be possible to select other numbers and positions.

As shown in FIGS. 7 to 9, the second work positioning mechanism 14 has three positioning modules 14A on the vertical support frame 11.

As shown in FIG. 9, the second work positioning mechanism 14 has a universal joint 14*a*, a first movement portion 14*b*, a horizontal table 14*d*, a second movement portion 14*e*, a vertical stand 14*f*, a drive motor 14*h*, a feed screw 14*g* and a slide member 14*c*. The universal joint 14*a*, which is on the first movement portion 14*b*, is mechanically coupled with a bracket 11*c* of the vertical support frame 11. The horizontal table 14*d* and the second movement portion 14*e* are located so that they confront the bottom surface and the diagonal surface of the first movement portion 14*b*, respectively. The vertical stand 14*f* is located confronting the side surface of the second movement portion 14*e*. The drive motor 14*h* is attached to the vertical stand 14*f*. The feed screw 14*g* mechanically couples the drive motor 14*h* and the second movement portion 14*e* so that the drive force generated by the drive motor 14*h* can be transmitted to the second movement portion 14*e*. The slide member 14*c* slidably engages with both the horizontal table 14d and the vertical stand 14f. The vertical stand 14f is secured to a U-support frame 13C of the first work positioning mechanism 13.

The second work positioning mechanism 14, which drives the feed screw 14g with the drive motor 14h so as to slide the second movement portion 14e, thereby sliding the first movement portion 14b in the Z-direction. Because the second work positioning mechanism 14 accurately provides horizontal (the optical-axis direction) sliding for the vertical support frame 11 which engages with the universal joint 14a, it is possible to appropriately adjust the geometric conditions of the exposure surface of the work W.

In this connection, it is possible to assign individually different amounts of movement for three positioning modules 14A, respectively. A universal joint 14a of each of the positioning modules 14A supports the vertical support frame 11 according to the gradient of the work W created by the movement. In this way, even if the exposure surface of the work W has a gradient, the second work positioning mechanism 14 can always adjust the geometrical conditions of the exposure surface of the work W appropriately because it is able to control the three positioning modules 14A so as to move different amounts in Z-direction relative to each other.

As shown in FIG. 8, the first work positioning mechanism 13 has a movement stand 13A, a vertical movement frame 13B and a U-support frame 13C. The U-support frame 13C holds the second work positioning mechanism 14. The vertical movement frame 13B slides the U-support frame 13C in Y-direction (vertical direction) in a vertical plane. The movement stand 13A slides the vertical movement frame 13B in X-direction (vertical to Y-direction) in the vertical plane.

As shown in FIGS. 7 and 8, the movement stand 13A has a rail 13a and a bar 13b. An opening 17a for exposure is made substantially in the middle of the movement stand 13A. A detector module 15 for detecting the geometric conditions of the exposure surface of the work W, and an image module 16 used for alignment adjustment are located around the opening 17a.

The vertical movement frame 13B has a rail guide 13c which slides along the rail 13a, and a coupling plate 13d coupled with the bar 13b. The vertical movement frame 13B has a vertical rail 13e along which the U-support frame 13C vertically slides. In the middle of the vertical movement frame 13B is made an opening 17b which is bigger than the opening 17a for exposure made in the movement stand 13A.

As shown in FIG. 8, the second work positioning mechanism 14 is secured to the front surface of the U-support frame 13C. In addition, a vertical rail guide 13f, which slides along the vertical rail 13e laid out on the vertical movement frame 13B, is laid out on the back surface of the U-support frame 13C.

Figure 10:
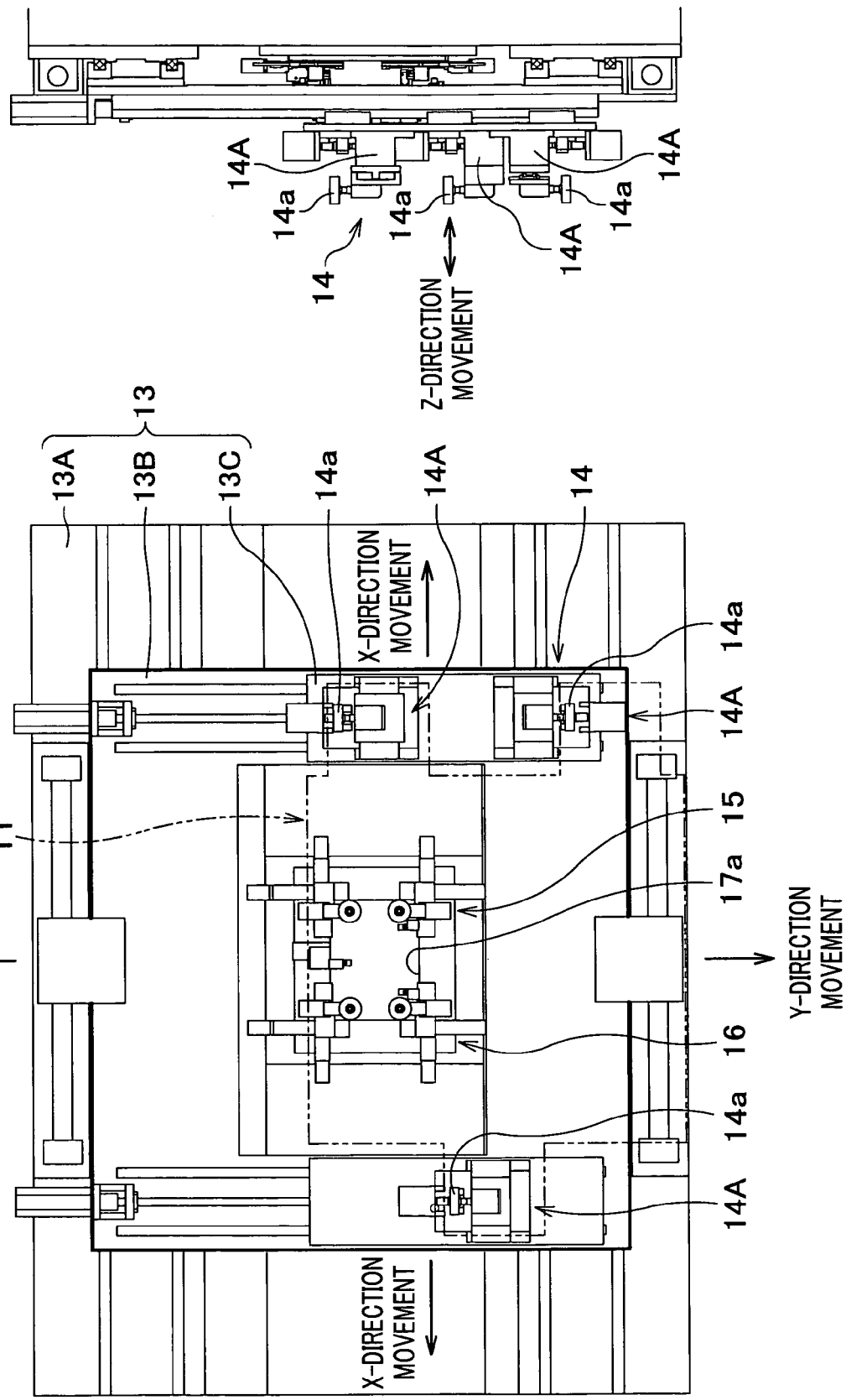
FIG. 10A is a front view showing the first work positioning mechanism of an apparatus for projection exposure according to the present invention.
FIG. 10B is a side view showing the first work positioning mechanism of an apparatus for projection exposure according to the present invention.

As shown in FIG. 10, the first work positioning mechanism 13, which has a drive module (not shown) such as a drive motor, slides the vertical support frame 11 in X and Y directions in the vertical plane along the rail 13a and the vertical rail 13e, respectively; via the movement stand 13A, the vertical movement frame 13B and the U-support frame 13C. In this way, the first work positioning mechanism 13 moves the exposure surface of the work W so as to meet the position of the opening 17a made in the movement stand 13A. Also it is possible to use the first work positioning mechanism 13 in adjusting the alignment between the work W and the mask M.

Figure 11:
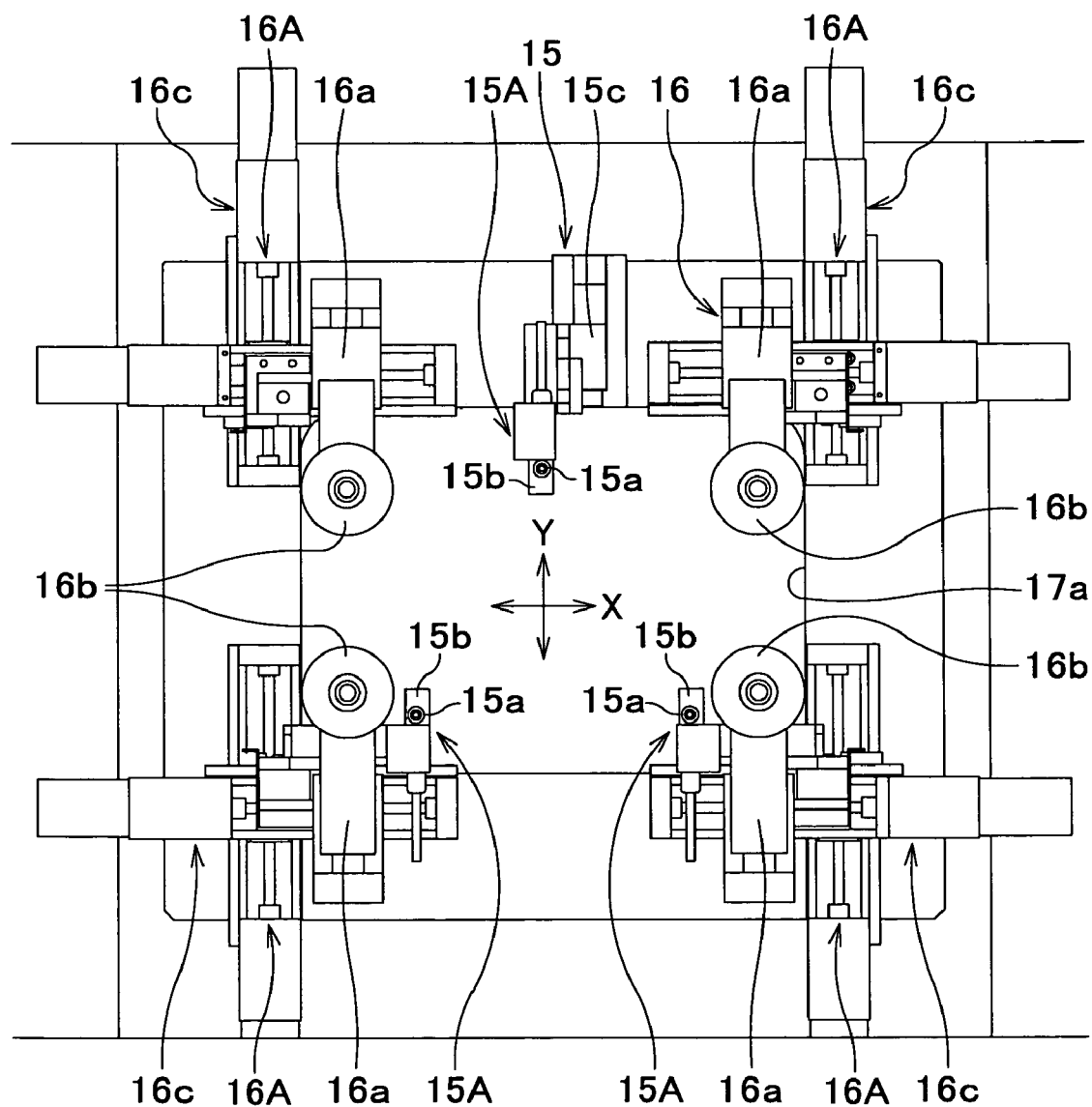
FIG. 11 is a front view showing the image module and the detector module of an apparatus for projection exposure according to the present invention.

As shown in FIG. 11, the detector module 15 has three detectors 15A. Each detector 15A has a contact portion 15a touching the surface of work W, a main portion 15b which is able to control the position of the contact portion 15a in Z-direction and a drive module 15c which is able to move the main portion 15b. In this connection, two of the three detectors 15A move interlocking with XY drive modules 16c. The relative location of the three detectors 15A is adapted so that each one occupies one of the three apexes of an isosceles or equilateral triangle.

In the detector module 15, three contact portions 15a come into contact with predetermined three points at predetermined pressures, respectively. And main portions 15b determine the geometric conditions of the exposure surface of the work W, which include at least the gradient of the exposure surface and the spatial relationship between the exposure surface and the image forming plane. The information thus detected by the detector module 15 is conveyed to the second work positioning mechanism 14 so as to determine the movement requirements for each of the three positioning modules 14A.

As shown in FIG. 11, the image module 16 has four imaging portions 16A, each of which has an illumination portion 16a, a CCD camera 16b and an XY drive module 16c. The illumination portion 16a illuminates the work mark Wm with the light rays carrying the mask mark Mm (see FIG. 1) for alignment adjustment. The illumination portion 16a is able to optically separate the light rays for alignment and those reflected by the work mark Wm, individual images of which are captured by the CCD camera 16b. The XY drive module 16c moves the illumination portion 16a and the CCD camera 16b in X and Y directions.

In the apparatus 1, as shown in FIGS. 1 and 11, the light rays generated by the discharge lamp 2a are guided into the visible-light filter 4f to select visible light. The visible light, which is then constituted so as to carry the information on the mask mark Mm, is emitted to the work mark Wm by the illumination portion 16a via the projection optical system 6. Because the illumination portion 16a, which has means for separating light rays, a half mirror for example, the CCD camera 16b is able to capture images for the mask mark Mm and the work mark Wm.

In the present embodiment, the visible-light filter 4f, the image module 16 and the first work positioning mechanism 13 cooperate to serve as an alignment mechanism referred to in "SUMMARY OF THE INVENTION". It is assumed in the description of the present embodiment that the work W is adapted to move relative to the mask M, whose position is fixed except for its replacement.

Figure 12A:
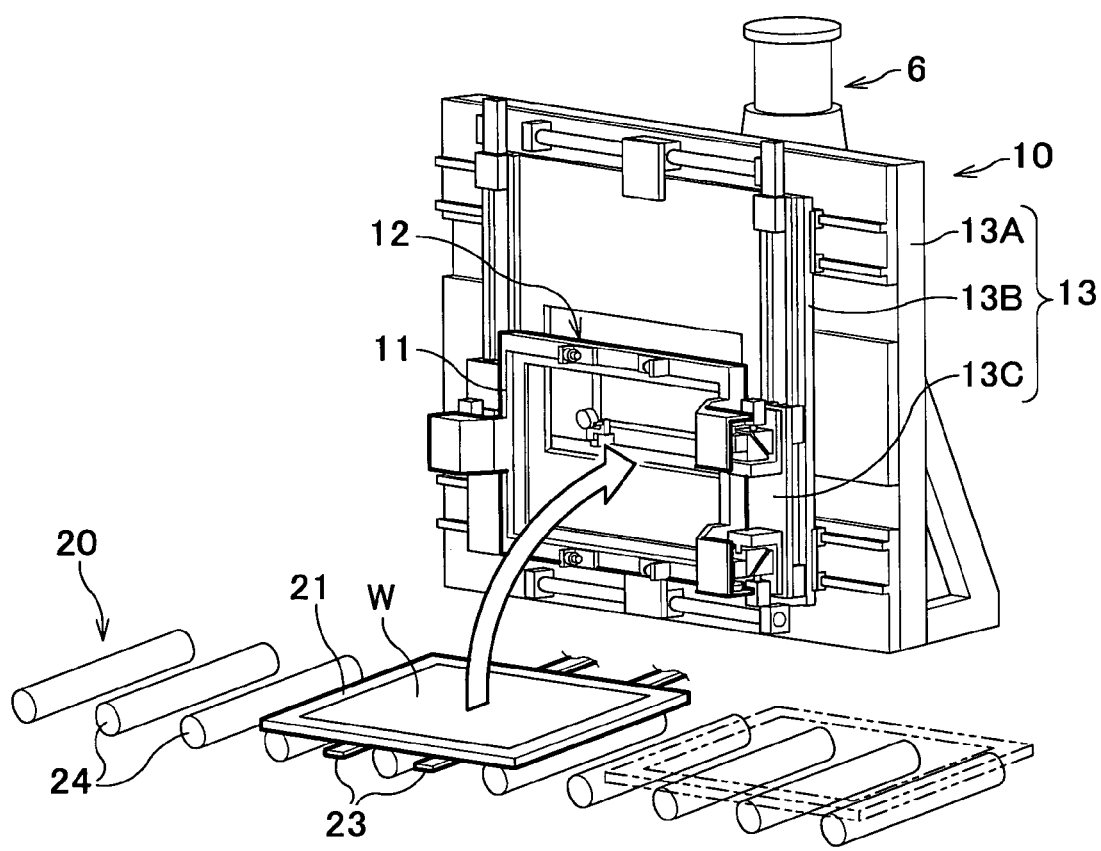
FIGS. 12A and 12B are perspective views showing the work, which is vertically supported, of an apparatus of projection exposure according to the present invention.
Figure 12B:
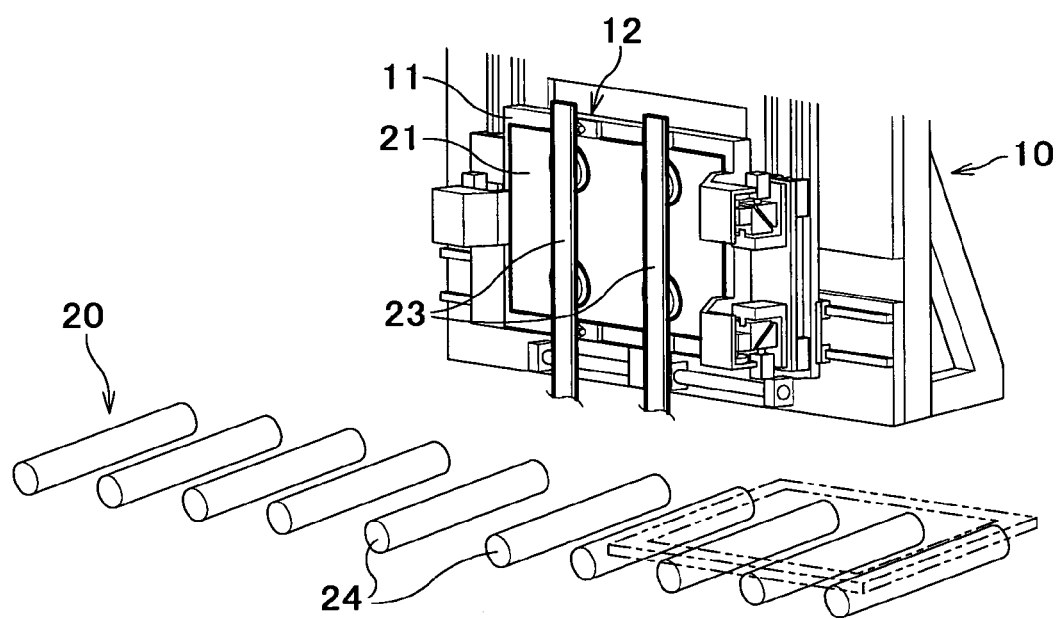
Figure 13:
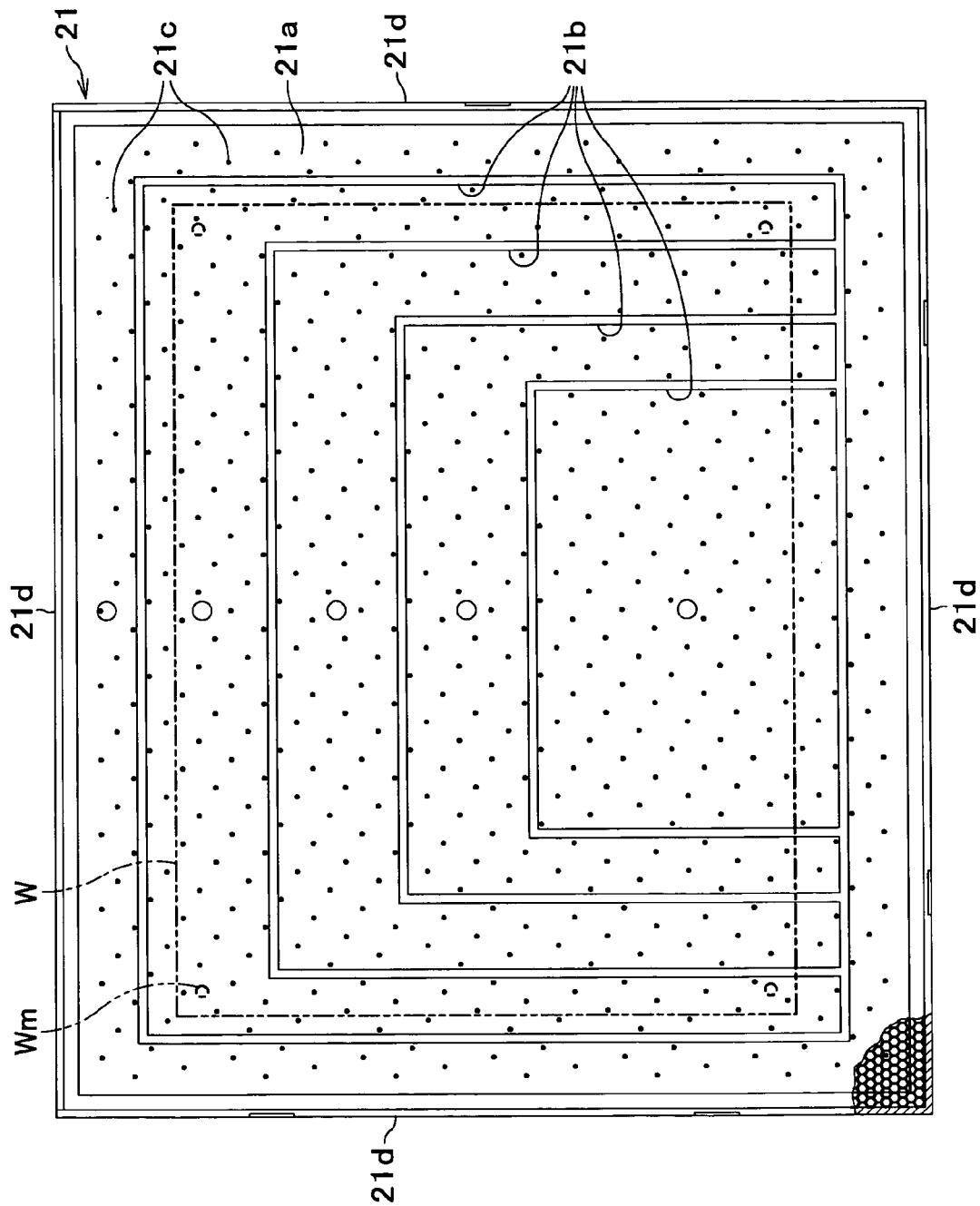
FIG. 13 is a plan view showing the mounting plate, on which a work is placed, of an apparatus of projection exposure according to the present invention.
Figure 14:
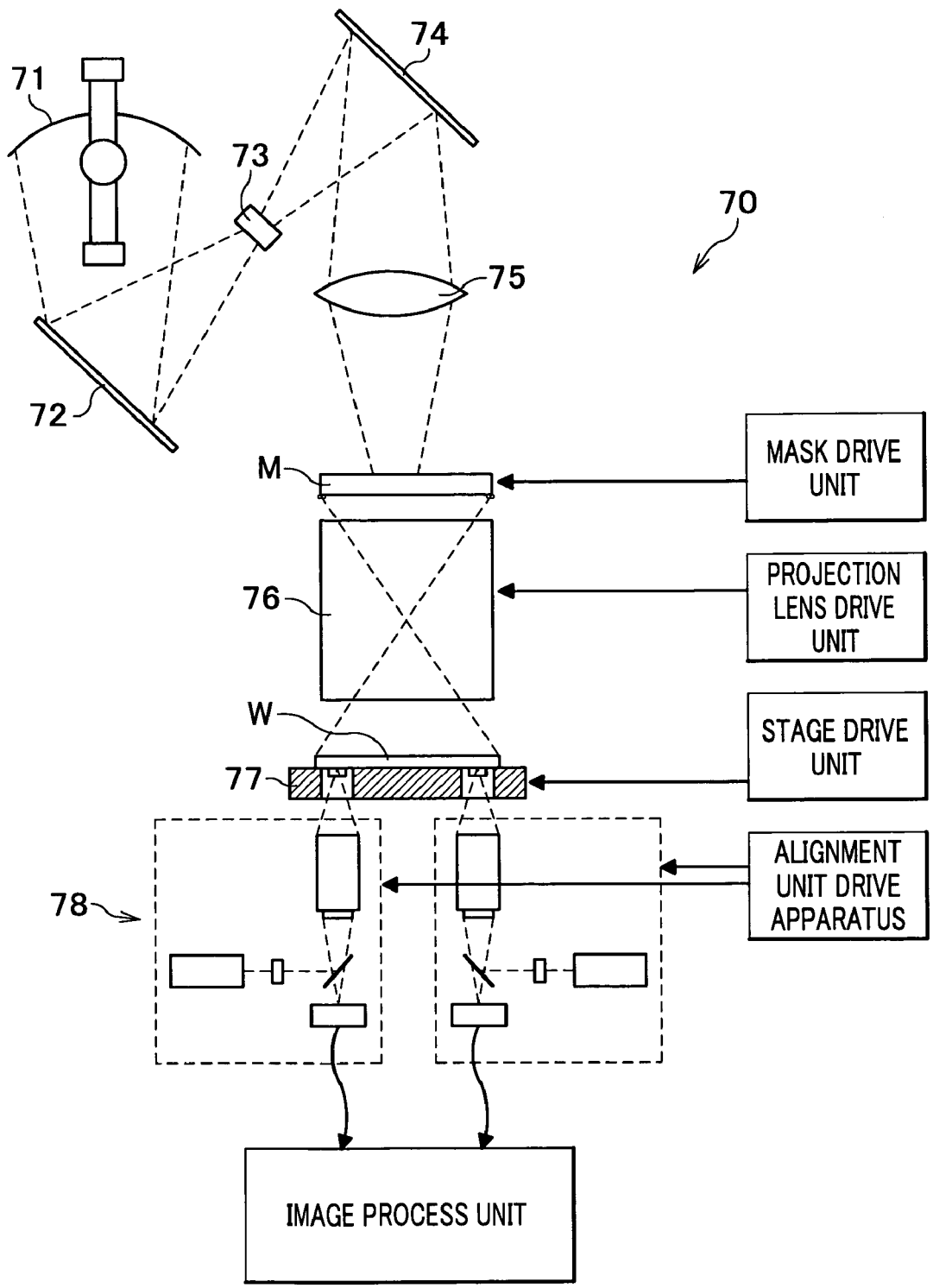
FIG. 14 is a schematic diagram illustrating a conventional apparatus for projection exposure.
Figure 15A:
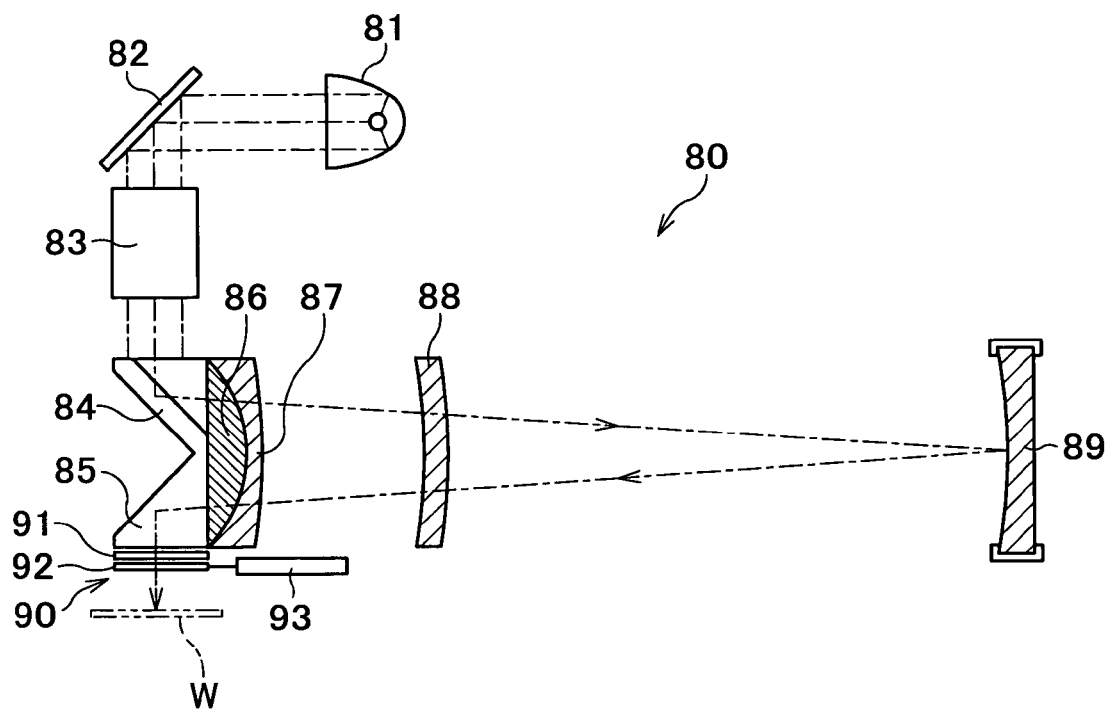
FIG. 15A is a schematic diagram illustrating a conventional apparatus for projection exposure.
Figure 15B:
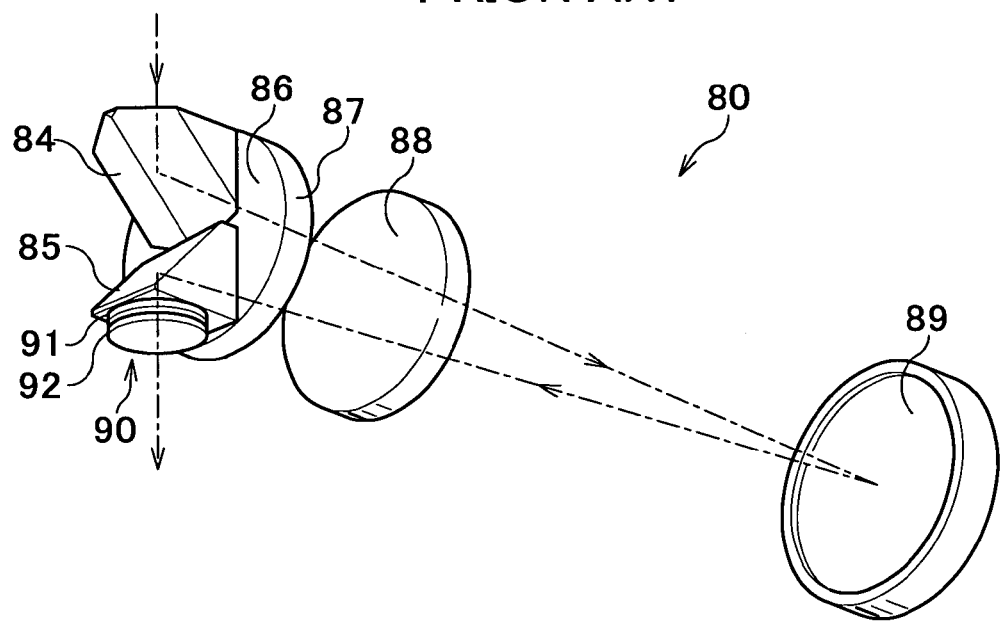
FIG. 15B is a perspective view showing the conventional projection optical system of an apparatus for projection exposure.

As shown in FIGS. 12 and 13, the carrying mechanism 20 for the work W has a mounting plate 21, a roller 24 and a mounting mechanism 23. The mounting plate 21 to which the work W is mounted travels on the roller 24. The mounting mechanism 23 provides movement from the horizontal to vertical position and vice versa for the mounting plate 21 so that the mounting plate 21 can be handed over between the vertical support frame 11 and the roller 24.

As shown in FIG. 13, the mounting plate 21 has a front plate 21a, and a side plate 21b and a back plate (not shown). The mounting plate 21 is formed hollow by these plates and is partitioned into sections by side plates 21b. The front plate 21a having a plurality of holes is able to hold the work W, sucking it with a vacuum module (not shown). It may be preferable to increase the stiffness of the mounting plate 21 so as to maintain its flatness by inserting honeycomb cores between the front plate 21a and the back plate.

It is possible not only to make the whole structure of the apparatus 1 for projection exposure compact but also to increase its flexibility in terms of layout because the carrying mechanism 20 can be laid out independent of the work support mechanism 10.

Operation of the apparatus 1 for projection exposure is now described. As shown in FIG. 12A, when its thickness is less than 0.3 mm, the work W is carried on the roller 24 while it is placed on the mounting plate 21. In this connection, it may be possible to carry the work W without the mounting plate 21 if its thickness is great enough to keep its flatness. When the mounting plate 21 comes to a stop at a predetermined position, where the mounting mechanism 23 lies, the mounting plate 21 is oriented in a vertical position from the prior horizontal position and subsequently handed over to the vertical support frame 11 by the mounting mechanism 23.

The vertical support frame 11, which receives the mounting plate 21 with the work W, activates the drive member 12b. The contact member 12a securely holds the back of the mounting plate 21 while the periphery of the work W contacts with the contact portion 11a, and the exposure surface of the work W confronts the frame opening 11d.

As shown in FIG. 12B, when the work W and the mounting plate 21 are fixed to the vertical support frame 11 via the attachment member 12, the work support mechanism 10 vertically moves the U-support frame 13C with the vertical rail 13e and the vertical rail guide 13f. Furthermore, the work support mechanism 10 laterally moves the vertical movement frame 13B, via rail guide 13c coupled with the rail 13a and the coupling plate 13d coupled with the bar 13b, so that the exposure surface of the work W is adapted to confront the opening 17a for exposure.

The steps described above are called setting of a work W.

It may be possible to anticipate several cases in selecting an example of the exposure surface of the work W. For example, the following cases can be named, in which an exposure surface occupies the whole surface of the work W and the exposure surface is equally divided into two or four sections. When the exposure surface is positioned so as to confront the opening 17a, the contact portion 15a of each of the three detectors 15A moves to a predetermined position of the work W, its periphery for example, via the XY drive module 16c of image module 16 and the drive module 15c of detector module 15. The contact portion 15a then moves from the main portion 15b to the work W so that its tip can touch the work W, thereby detecting the relative position of the exposure surface of the work W.

The steps described above are called detection of the geometric conditions of the exposure surface of a work W.

Even if the gradient of the exposure surface of a work W is acceptable, the relative position of the exposure surface possibly happens to deviate from the location of the image focusing plane in Z-direction (optical axis direction). The detector module 15 accordingly sends a command signal to the second work positioning mechanism 14, thereby moving each of the three positioning modules 14A by the same amount as that of the deviation in Z-direction. In this way, the second work positioning mechanism 14 moves the vertical support frame 11 in Z-direction, adjusting the relative position of the exposure surface.

When the results of the three detectors 15A differ from each other, the detector module 15 sends command signals, thereby moving each of the three positioning modules 14A independently. If each of the three modules 14A is independently moved, the geometric conditions of the exposure surface of the work W can be appropriately adjusted, because a bracket 11c of the vertical frame 11 and a positioning module 14A are coupled via a universal joint 14a.

The steps described above are called adjustment of the geometric conditions of the exposure surface of a work W.

An alignment adjustment is conducted after the geometric conditions of the exposure surface of the work W are orderly controlled by the detector module 15 and the second work positioning mechanism 14. First, rotating the disk 4A of the rotation mechanism 4, the visible-light filter 4f is positioned in the optical path by replacing the blocking portion 4d. It is noted that the discharge lamp 2a has been stably turned on.

The light rays generated by the light source 2, which are reflected by the first and second reflectors 3a and 3b, pass through the visible-light filter 4f, turning to visible light rays which do not affect the exposure of the work W. After the visible light rays pass through the fly's eye lens 3c and the collimating lens 3d, and are reflected by the third reflector 3e, they illuminates the mask M, turning to the visible light rays carrying the information on the position of the mask mark Mm. The light rays not only illuminate the work mark Wm but also impinge on the CCD camera 16b via the optical system 19 and the illumination portion 16a. At the same time, the light rays reflected by the work W, which carry the information on the position of the work mark Wm, impinge on the CCD camera 16b via the illumination portion 16a.

In the apparatus 1, a control module (not shown) executes a calculation according to the positions of the work mark Wm and the mask mark Mm. If both marks Wm and Mm fall in an allowable range, the control module advances the step to exposure. If not, the apparatus 1 commands the control module via the first work positioning mechanism 13 to conduct an alignment adjustment by moving the exposure surface of the work W so as to meet the pattern of the mask M.

The steps described above are called adjustment of alignment.

After the apparatus 1 completes the alignment adjustment, it conducts a projection exposure of the work W. The apparatus 1 moves the image module 16 and the detection module 15 to a waiting position, and rotates the disk 4A by a predetermined angle so as to position the opening 4e in the optical path, replacing the visible-light filter 4f.

These steps described above are called projection exposure.

When the opening 4e is positioned in the optical path, the light rays generated by the light source 2 is projected onto the exposure surface of the work W for a predetermined period of time via the illumination optical system 3, the mask M and the projection optical system 6.

When the projection exposure is completed for one exposure surface of the work W, the apparatus 1 positions the blocking portion 4d in the optical path. The apparatus 1 moves a next exposure surface of the work W so as to confront the opening 17a for exposure in collaboration with the first work positioning mechanism 13. Subsequently, the steps described above, detection of the geometric conditions, adjustment of the geometric conditions, adjustment of alignment and projection exposure, are repeated. In this way, all the exposure surfaces of the work W undergo projection exposure.

After the apparatus 1 completes the projection exposure for all the exposure surfaces of the work W, it positions the blocking portion 4d in the optical path, replacing the opening 4e, thereby intercepting the light rays generated by the light source 2.

When the light rays are intercepted, the apparatus 1 commands the first work positioning mechanism 13 to move the vertical support frame 11 to the location where the mounting mechanism 23 lies. Subsequently, the mounting mechanism 23 sucks the mounting plate 21, and the apparatus 1 releases the attachment member 12, delivering the work W and the mounting plate 21 to the mounting mechanism 23.

Receiving the combined work W and mounting plate 21, the mounting mechanism 23 delivers the mounting plate 21 to the roller 24. The carrying mechanism 20 carries the combined work W and mounting plate 21 to a transit port. When the work and the mounting plate 21 are carried out, a new work W which is placed on a mounting plate 21 is carried in to the mounting mechanism 23 and undergoes the sequential steps described above.

If an expansion or contraction of the work is observed at an alignment adjustment, enlargement or reduction of the pattern of the mask M, which can be done by a movement of the input and output convex lenses 6a and 6b of the projection optical system 6 in the optical axis direction, is conducted. During this operation, the drive mechanism 7d of the slide mechanism 7 moves the support table 7a in the optical axis direction, which holds the lenses 6a and 6b at a predetermined distance. The relationship between magnification and the movement of lenses 6a and 6b is in advance stored in a control module (not shown) belonging to the slide mechanism 7.

When the work W is contracted, it is necessary to reduce the exposure pattern of the mask M. In order to reduce the magnification, the drive mechanism 7d moves the support table 7a along the slide rail 7c so that the support table is adapted to be apart from the work W. In this way, the input convex lens 6a recedes from the reflector 8, but the output convex lens 6b comes closer to the reflector 8. The apparatus 1, which is able to simultaneously make both convex lenses 6a and 6b recede from the work W, can reduce the magnification without any effect on focusing.

On the other hand, it is possible to increase the magnification, preserving the advantages described above, if the support table 7a is made to come closer to the work W.

Therefore, it is possible to conduct the projection exposure according to the condition of the work W, expanded or contracted, by just simultaneously moving both lenses 6a and 6b of projection optical system 6 without an adjustment of the optical system 19.

It is also possible to quickly replace the exposure pattern of the mask M if the mask M is slidably made to move in the vertical direction by the switching mechanism 5c of the mask support mechanism 5. When a work W is exposed both sides, it is possible to quickly replace the pattern if exposure patterns for the front and back of the work W are formed on a mask M in an up-down direction.

What is claimed is:

1. An apparatus for projection exposure which projects a pattern of a mask onto a work comprising:
    a base;
    a source of light for producing light rays carrying ultraviolet light of a predetermined wave length;
    an optical system which constitutes the light rays into projection light rays carrying image information of the mask and guides the projection light rays through a predetermined optical path so that the projection light rays can be projected onto an exposure surface of the work;
    a mask support mechanism for vertically supporting the mask relative to the base;
    a work support mechanism for vertically supporting the work relative to the base so that the exposure surface of the work can coincide with an image forming plane in the optical path; and
    an alignment mechanism for adjusting an alignment between the exposure surface of the work and the mask;
    the optical system comprising:
    a projection optical system which is disposed between the mask support mechanism and the work support mechanism substantially vertically relative to the base; and
    an illumination optical system which is disposed between the source of light and the mask support mechanism;
    wherein the projection optical system comprises:
    an input convex lens which the projection light rays penetrate so as to be refracted;
    an output convex lens through which the projection light rays travel out and the output convex lens being adapted to have an optical axis in common with the input convex lens; and
    a reflector having first and second reflection surfaces which form a predetermined angle, and the reflector being positioned between the input and output convex lenses.

2. The apparatus according to claim 1, wherein the projection optical system further comprises:
    a reflection compensating optical system for reflecting the projection light rays, which are reflected by the first reflection surface, back to the second reflection surface; and
    a slide mechanism to which the input and output convex lenses are attached with a predetermined distance therebetween;
    wherein the slide mechanism is able to move the lenses in a direction of the optical axis of the lenses.

3. The apparatus according to claim 1, wherein the work support mechanism comprises:
    a mounting plate to which the work is mounted
    a vertical support frame for vertically relative to the base supporting the mounting plate to which the work is mounted, and the vertical support frame having a frame opening which confronts the exposure surface of the work;
    an attachment member for attachably or detachably fixing the mounting plate to the vertical support frame; and
    a first work positioning mechanism which supports and moves the vertical support frame within a vertical plane in which the work is positioned.

4. The apparatus according to claim 3, wherein the first work positioning mechanism is positioned closer side of the projection optical system relative to the image forming plane which coincides with the exposure surface of the work.

5. The apparatus according to claim 1, wherein the work support mechanism comprises:
    a detector module for detecting geometric conditions of the exposure surface of the work; and
    a second work positioning mechanism for moving a vertical support frame according to the geometric conditions in a horizontal direction perpendicular to a vertical plane in which the work is positioned.

6. The apparatus according to claim 1, wherein the mask support mechanism comprises:
    a mask support frame for vertically supporting the mask relative to the base;
    a mask positioning mechanism which supports and moves the mask support frame within a vertical plane in which the mask is positioned; and a switching mechanism which supports and slides the mask support frame vertically relative to the base so that a pattern of the mask to be projected can be replaced, and the switching mechanism supporting the mask positioning mechanism.

7. The apparatus according to claim 1, wherein the optical system comprises a disk which is rotatably disposed in the optical path of the optical system, and the disk comprising:
 a visible-light filter for selecting visible light from the light rays produced by the light source;
 a blocking portion, by which the light rays are intercepted, being disposed next to the filter; and
 an opening, through which the light rays pass, being disposed next to the blocking portion.

8. A method for projection exposure using a projection optical system which comprises:
 a reflector having first and second reflection surfaces which steer a direction of light rays produced by a light source of an optical system;
 input and output convex lenses which are disposed on both sides of the reflector; and
 a reflection compensating optical system for reflecting the light rays, which are reflected by the first reflection surface, back to the second reflection surface;
 the method comprising the steps of:
 when a magnification of the projection optical system is adjusted to be low,
 moving the input and convex lenses so that the input convex lens can recede from the reflector and the output convex lens can come closer to the reflector in a direction of an optical axis while a distance between the input and output convex lenses is kept constant; and conducting projection exposure,
 when the magnification of the projection optical system is adjusted to be high,
 moving the input and output convex lenses so that the input convex lens can come closer to the reflector and the output convex lens can recede from the reflector in the direction of the optical axis while the distance between the input and output convex lenses is kept constant; and conducting projection exposure.

9. An apparatus for projection exposure which projects a pattern of a mask onto a work comprising:
 a base;
 a source of light for producing light rays carrying ultraviolet light of a predetermined wave length;
 an optical system which constitutes the light rays into projection light rays carrying image information of the mask and guides the projection light rays through a predetermined optical path so that the projection light rays can be projected onto an exposure surface of the work, the optical system comprising:
  a projection optical system which is disposed between the mask support mechanism and the work support mechanism substantially vertically relative to the base; and
  an illumination optical system which is disposed between the source of light and the mask support mechanism;
 a mask support mechanism including:
  a mask support frame for vertically supporting the mask relative to the base;
  a mask positioning mechanism which supports and moves the mask support frame within a vertical plane in which the mask is positioned; and
  a switching mechanism which supports and slides the mask support frame vertically relative to the base so that a pattern of the mask to be projected can be replaced, and the switching mechanism supporting the mask positioning mechanism;
 a work support mechanism for vertically supporting the work relative to the base so that the exposure surface of the work can coincide with an image forming plane in the optical path; and
 an alignment mechanism for adjusting an alignment between the exposure surface of the work and the mask.

* * * * *